US012672363B2

(12) United States Patent
Sonobe

(10) Patent No.: US 12,672,363 B2
(45) Date of Patent: Jun. 30, 2026

(54) AVALANCHE PHOTODIODE ARRAY

(71) Applicant: HAMAMATSU PHOTONICS K.K.,
Hamamatsu (JP)

(72) Inventor: Hironori Sonobe, Hamamatsu (JP)

(73) Assignee: HAMAMATSU PHOTONICS K.K.,
Hamamatsu (JP)

( * ) Notice: Subject to any disclaimer, the term of this
patent is extended or adjusted under 35
U.S.C. 154(b) by 370 days.

(21) Appl. No.: 18/571,881

(22) PCT Filed: Jun. 7, 2022

(86) PCT No.: PCT/JP2022/023014
§ 371 (c)(1),
(2) Date: Dec. 19, 2023

(87) PCT Pub. No.: WO2022/270301
PCT Pub. Date: Dec. 29, 2022

(65) Prior Publication Data
US 2024/0234616 A1 Jul. 11, 2024

(30) Foreign Application Priority Data
Jun. 23, 2021 (JP) ................................. 2021-103881

(51) Int. Cl.
*H10F 30/225* (2025.01)
*H10F 39/12* (2025.01)
(Continued)

(52) U.S. Cl.
CPC ..... *H10F 30/2255* (2025.01); *H10F 77/1243*
(2025.01); *H10F 77/334* (2025.01); *H10W*
*90/00* (2026.01)

(58) Field of Classification Search
CPC ...... H10F 39/12; H10F 39/107; H10F 30/225;
H10F 30/2255; G01J 1/02
See application file for complete search history.

(56) References Cited

U.S. PATENT DOCUMENTS

2003/0098463 A1* 5/2003 Vickers ................. H10F 30/225
257/E31.063
2003/0226952 A1* 12/2003 Clark .................. H10F 30/2255
250/214.1
(Continued)

FOREIGN PATENT DOCUMENTS

JP 2010-226073 A 10/2010
JP 2019-169643 A 10/2019
(Continued)

OTHER PUBLICATIONS

International Preliminary Report on Patentability mailed Jan. 4,
2024 for PCT/JP2022/023014.
(Continued)

*Primary Examiner* — Mohsen Ahmadi
(74) *Attorney, Agent, or Firm* — Faegre Drinker Biddle &
Reath LLP

(57) ABSTRACT

In an APD array, a plurality of APDs include a first semi-
conductor layer, a plurality of second semiconductor layers,
and a multiplication layer. The first semiconductor layer is
provided closer to the second surface than a semiconductor
region. The plurality of second semiconductor layers are
arranged along a first surface. The multiplication layer is
provided within the semiconductor region and provided
between the plurality of second semiconductor layers and
the first semiconductor layer in a direction perpendicular to
the first surface. Each of a third semiconductor layer and a
fourth semiconductor layer of the multiplication layer is
continuously provided so as to overlap the plurality of
second semiconductor layers when viewed in the direction
perpendicular to the first surface. The third semiconductor
layer is provided closer to the first surface than the fourth
semiconductor layer.

21 Claims, 15 Drawing Sheets

(51) Int. Cl.
| | |
|---|---|
| *H10F 77/124* | (2025.01) |
| *H10F 77/30* | (2025.01) |
| *H10W 90/00* | (2026.01) |

(56) References Cited

U.S. PATENT DOCUMENTS

| | | | | |
|---|---|---|---|---|
| 2004/0251483 | A1* | 12/2004 | Ko | H10F 30/2255 |
| | | | | 257/292 |
| 2005/0258449 | A1* | 11/2005 | Lutz | H10F 30/225 |
| | | | | 257/E31.063 |
| 2011/0024863 | A1* | 2/2011 | Koi | H10F 30/223 |
| | | | | 257/458 |
| 2011/0031578 | A1* | 2/2011 | Miura | H10P 14/271 |
| | | | | 438/59 |
| 2014/0210035 | A1* | 7/2014 | Park | H10F 39/107 |
| | | | | 257/458 |
| 2015/0054111 | A1* | 2/2015 | Niclass | H10F 30/225 |
| | | | | 257/438 |
| 2015/0179862 | A1* | 6/2015 | Yuan | B82Y 20/00 |
| | | | | 257/14 |
| 2016/0093648 | A1 | 3/2016 | Mirzoyan et al. | |

| | | | | |
|---|---|---|---|---|
| 2017/0229599 | A1 | 8/2017 | Sakata et al. | |
| 2018/0308881 | A1* | 10/2018 | Hynecek | G01S 17/10 |
| 2018/0374890 | A1 | 12/2018 | Cao et al. | |
| 2020/0028018 | A1* | 1/2020 | Iwata | H10F 30/225 |
| 2022/0123163 | A1* | 4/2022 | Yamada | H10F 71/139 |
| 2022/0384494 | A1* | 12/2022 | Morimoto | H10F 39/199 |

FOREIGN PATENT DOCUMENTS

| | | |
|---|---|---|
| JP | 2019-530215 A | 10/2019 |
| JP | 2020-096157 A | 6/2020 |
| JP | 2021-108345 A | 7/2021 |
| JP | 2023-002986 A | 1/2023 |
| WO | WO-2016/013170 A1 | 1/2016 |
| WO | WO-2018/057975 A1 | 3/2018 |
| WO | WO-2020/121851 A1 | 6/2020 |
| WO | WO-2021/131372 A1 | 7/2021 |

OTHER PUBLICATIONS

Extended European Search Report issued on Jun. 25, 2025 in corresponding European patent application 22828218.2 (10 pages).

* cited by examiner

AVALANCHE PHOTODIODE ARRAY

TECHNICAL FIELD

The present invention relates to an avalanche photodiode array.

BACKGROUND ART

An avalanche photodiode array is known (for example, Patent Literature 1). The avalanche photodiode array includes, for example, a plurality of avalanche photodiodes. In the avalanche photodiode array described in Patent Literature 1, a plurality of avalanche photodiodes are arranged on a semiconductor substrate.

CITATION LIST

Patent Literature

Patent Literature 1: Japanese Unexamined Patent Publication No. 2019-530215

SUMMARY OF INVENTION

Technical Problem

In a photodetection device using an avalanche photodiode array, there is a dead area where no light can be detected between adjacent avalanche photodiodes. A photodetection device described in Patent Literature 1 includes a microlens array and is configured to refract light, which is to be incident on a dead area without a microlens array, by the microlens and guide the refracted light to a detectable area. This can substantially expand the light receiving range.

However, in a configuration using a microlens array, the cost is high and there are many steps in the manufacturing process because of the microlens array. Therefore, in such a configuration, it is difficult to reduce the cost and the number of steps in the manufacturing process. In addition, in the configuration using a microlens array, no dead area reduction effect can be expected for electromagnetic waves and particle beams such as electron beams passing through the microlenses. For this reason, an avalanche photodiode array, which has a simple configuration with a reduced number of members such as microlens arrays, can reduce dead areas, and can realize detection of desired electromagnetic waves or particle beams, has been expected.

One aspect of the present invention is to provide an avalanche photodiode array that can reduce dead areas and realize detection of desired electromagnetic waves or particle beams with a simple configuration.

Solution to Problem

An avalanche photodiode array according to one aspect of the present invention includes a semiconductor substrate. The semiconductor substrate has a first surface and a second surface facing each other. The semiconductor substrate includes a semiconductor region of a first conductivity type provided on the first surface side. The semiconductor substrate has a plurality of avalanche photodiodes. The plurality of avalanche photodiodes are arranged along the first surface. The plurality of avalanche photodiodes include a first semiconductor layer of the first conductivity type, a plurality of second semiconductor layers of a second conductivity type, and a multiplication layer. The first semiconductor layer is provided closer to the second surface than the semiconductor region. The plurality of second semiconductor layers are arranged along the first surface. Each second semiconductor layer is surrounded by the semiconductor region when viewed in a direction perpendicular to the first surface. The multiplication layer is provided within the semiconductor region and provided between the plurality of second semiconductor layers and the first semiconductor layer in the direction perpendicular to the first surface. When viewed in the direction perpendicular to the first surface, the plurality of second semiconductor layers and the multiplication layer are provided within a range where the first semiconductor layer is located. The multiplication layer includes a third semiconductor layer of the second conductivity type and a fourth semiconductor layer of the second conductivity type facing each other. The third semiconductor layer is provided closer to the first surface than the fourth semiconductor layer. Each of the third semiconductor layer and the fourth semiconductor layer is continuously provided so as to overlap the plurality of second semiconductor layers when viewed in the direction perpendicular to the first surface.

According to the aspect described above, the plurality of avalanche photodiodes include the first semiconductor layer of the first conductivity type, the plurality of second semiconductor layers of the second conductivity type, and the multiplication layer. Each of the third semiconductor layer and the fourth semiconductor layer of the multiplication layer is continuously provided so as to overlap the plurality of second semiconductor layers when viewed in the direction perpendicular to the first surface. In this case, carriers generated by the incidence of electromagnetic waves or particle beams to be detected are multiplied by the multiplication layer that is continuously provided so as to overlap the plurality of second semiconductor layers. The carriers multiplied in the multiplication layer are output from each second semiconductor layer. According to this configuration, dead areas can be reduced. Since the multiplication layer is provided separately from the plurality of second semiconductor layers, concentration of the electric field in each second semiconductor layer is suppressed. Therefore, edge breakdown is also suppressed in each second semiconductor layer. For this reason, in a simple configuration without a microlens array and the like, dead areas can be reduced and desired electromagnetic waves or particle beams can be detected. According to this configuration, the sensitive layer can be relatively wide. Therefore, in particular, the detection of electromagnetic waves or particle beams that require a relatively wide sensitivity layer can be realized.

According to the aspect described above, an impurity concentration of the first semiconductor layer and an impurity concentration of the fourth semiconductor layer may be higher than an impurity concentration of the semiconductor region. The impurity concentration of the first semiconductor layer may be higher than the impurity concentration of the fourth semiconductor layer. An impurity concentration of each of the second semiconductor layers may be higher than an impurity concentration of the third semiconductor layer.

According to the aspect described above, in the direction perpendicular to the first surface, a shortest distance between the first semiconductor layer and the fourth semiconductor layer may be greater than a shortest distance between the plurality of second semiconductor layers and the third semiconductor layer. In this case, a relatively wide sensitive layer is secured between the first semiconductor layer and the fourth semiconductor layer. Therefore, the detection accuracy of electromagnetic waves or particle beams that require a relatively wide sensitivity layer can be improved.

According to the aspect described above, an impurity concentration of the third semiconductor layer may be higher than an impurity concentration of the fourth semiconductor layer. In this case, during operation, the electric field strength between the first semiconductor layer and the fourth semiconductor layer is greater than the electric field strength between the first surface and the third semiconductor layer. Therefore, since the movement speed of the generated carriers is ensured between the first semiconductor layer and the fourth semiconductor layer, high-speed response can be realized. Edge breakdown between the plurality of second semiconductor layers and the multiplication layer can be further suppressed.

According to the aspect described above, assuming that any position from the first surface in the direction perpendicular to the first surface is "x", an impurity concentration of the third semiconductor layer at the any position "x" is "f(x)", an impurity concentration of the fourth semiconductor layer at the any position "x" is "g(x)", a thickness of the third semiconductor layer in the direction perpendicular to the first surface is "$L_\alpha$", a thickness of the fourth semiconductor layer in the direction perpendicular to the first surface is "$L_\beta$", a shortest distance between the first surface and the third semiconductor layer in the direction perpendicular to the first surface is "A", and a shortest distance between the first surface and the fourth semiconductor layer in the direction perpendicular to the first surface is "B", Equation (1) may be satisfied.

[Equation 1]

$$\int_{A}^{A+L_\alpha} f(x)\ dx \geq \int_{B}^{B+L_\beta} g(x)\ dx \tag{1}$$

In this case, since the movement speed of the generated carriers is ensured between the first semiconductor layer and the fourth semiconductor layer, high-speed response can be realized. Edge breakdown can be further suppressed between the plurality of second semiconductor layers and the multiplication layer.

According to the aspect described above, when viewed in the direction perpendicular to the first surface, the semiconductor substrate may include a fifth semiconductor layer of the second conductivity type surrounding an entire region where the plurality of second semiconductor layers are arranged. When viewed in the direction perpendicular to the first surface, the third semiconductor layer and the fifth semiconductor layer may overlap each other at least in part. In this case, the gain variation in each second semiconductor layer can be further reduced. In addition, the movement of carriers generated outside the detection target range to the second semiconductor layer can be suppressed.

According to the aspect described above, when viewed in the direction perpendicular to the first surface, an edge of each of the second semiconductor layers may be covered by a junction termination extension region. The junction termination extension region covering each of the second semiconductor layers may be a semiconductor region of the second conductivity type having an impurity concentration lower than an impurity concentration of the second semiconductor layer. In this case, edge breakdown in each second semiconductor layer can be further suppressed.

According to the aspect described above, a portion of each of the second semiconductor layers facing the semiconductor region may be covered with the junction termination extension region. In this case, edge breakdown in each second semiconductor layer can be further suppressed.

According to the aspect described above, the junction termination extension region covering each of the second semiconductor layers may be spaced apart from the multiplication layer. In this case, the electric field strength between each second semiconductor layer and the multiplication layer can be more uniform.

According to the aspect described above, when viewed in the direction perpendicular to the first surface, an edge of the fifth semiconductor layer may be covered by a junction termination extension region. The junction termination extension region covering the fifth semiconductor layer may be a semiconductor region of the second conductivity type having an impurity concentration lower than an impurity concentration of the fifth semiconductor layer. In this case, edge breakdown in the fifth semiconductor layer can be suppressed.

According to the aspect described above, the semiconductor substrate may include a sixth semiconductor layer of the first conductivity type. The sixth semiconductor layer may be provided between the second semiconductor layers adjacent to each other among the plurality of second semiconductor layers when viewed in the direction perpendicular to the first surface. An impurity concentration of the sixth semiconductor layer may be higher than an impurity concentration of the semiconductor region. In this case, the movement of carriers between the second semiconductor layers adjacent to each other can be suppressed.

According to the aspect described above, in the direction perpendicular to the first surface, a thickness of the sixth semiconductor layer may be smaller than a thickness of each of the second semiconductor layers. In this case, edge breakdown between the sixth semiconductor layer and the third semiconductor layer can be suppressed.

According to the aspect described above, the semiconductor substrate may contain silicon. The second conductivity type may be N-type.

According to the aspect described above, the semiconductor substrate may contain indium phosphide. The second conductivity type may be P-type.

According to the aspect described above, the multiplication layer may be provided within a range of 10 µm or less from the first surface in the direction perpendicular to the first surface. In this case, the structure is relatively easy to form.

According to the aspect described above, a width of each of the second semiconductor layers in a direction along the first surface may be greater than 10 µm. In this case, the size of each pixel to be detected can be secured.

According to the aspect described above, when viewed in the direction perpendicular to the first surface, the multiplication layer may include a pair of edges facing each other. Three or more of the plurality of second semiconductor layers may be arranged in a direction in which the pair of edges face each other. When viewed in the direction perpendicular to the first surface, the plurality of second semiconductor layers may be located between the pair of edges in the facing direction. In this case, the gain variation in each second semiconductor layer can be further suppressed.

According to the aspect described above, when viewed in the direction perpendicular to the first surface, in the plurality of second semiconductor layers, an area of a region where each of the second semiconductor layers and the multiplication layer overlap each other may be the same. In this case, the gain variation in each second semiconductor layer can be further suppressed.

According to the aspect described above, when viewed in the direction perpendicular to the first surface, an edge of the multiplication layer may overlap a shielding member. In this case, the generation of carriers outside the detection target area can be suppressed.

According to the aspect described above, each of the avalanche photodiodes may be of a front surface incidence type in which detection light is incident from the first surface or a back surface incidence type in which detection light is incident from the second surface.

According to the aspect described above, when viewed in the direction perpendicular to the first surface, a portion of each of the second semiconductor layers overlapping the multiplication layer may have a rectangular shape extending in a direction along the first surface.

According to the aspect described above, when viewed in the direction perpendicular to the first surface, a width of each of the second semiconductor layers may be greater than a shortest distance between the second semiconductor layers adjacent to each other. In this case, since the directions of the electric lines of force from the second semiconductor layer are aligned, generated carriers are easily guided to the second semiconductor layer.

Advantageous Effects of Invention

According to one aspect of the present invention, it is possible to provide an avalanche photodiode array that can reduce dead areas and realize detection of desired electromagnetic waves or particle beams with a simple configuration.

DESCRIPTION OF EMBODIMENTS

Figure 1:
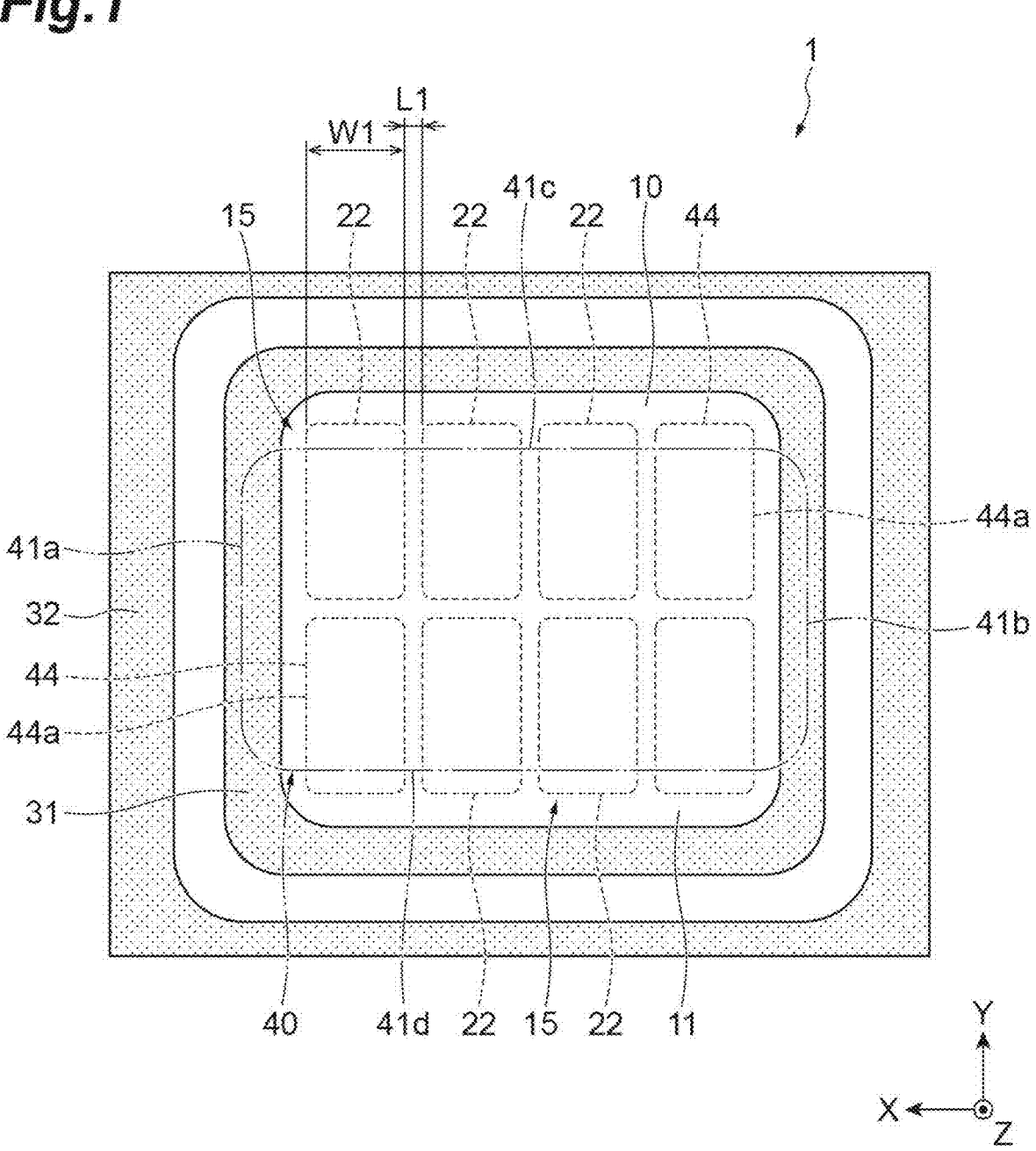
FIG. 1 is a schematic plan view of an avalanche photodiode array according to the present embodiment.

Hereinafter, an embodiment of the present invention will be described in detail with reference to the accompanying diagrams. In addition, in the description, the same elements or elements having the same function are denoted by the same reference numerals, and repeated descriptions thereof will be omitted.

Figure 2:
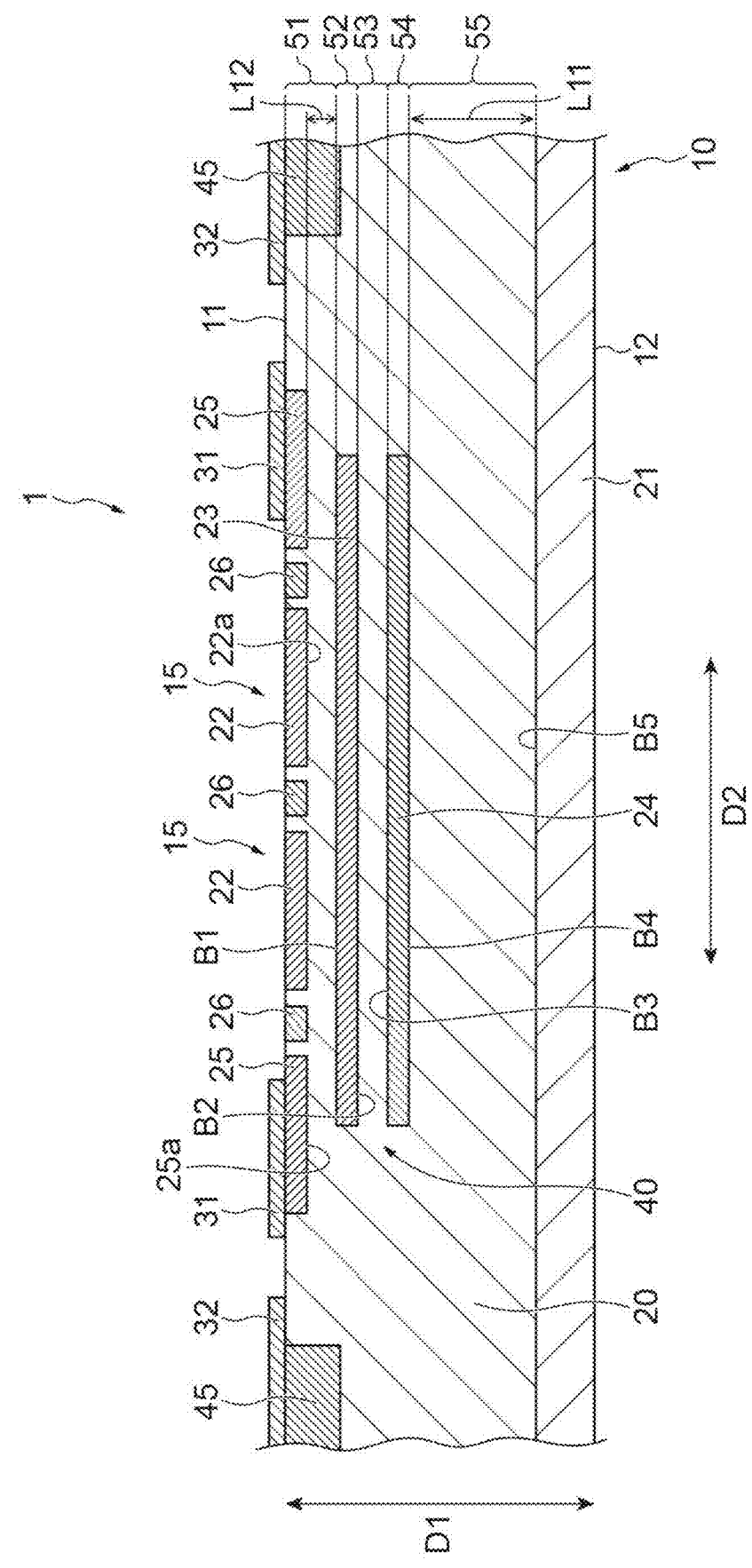
FIG. 2 is a cross-sectional view of the avalanche photodiode array.
Figure 3:
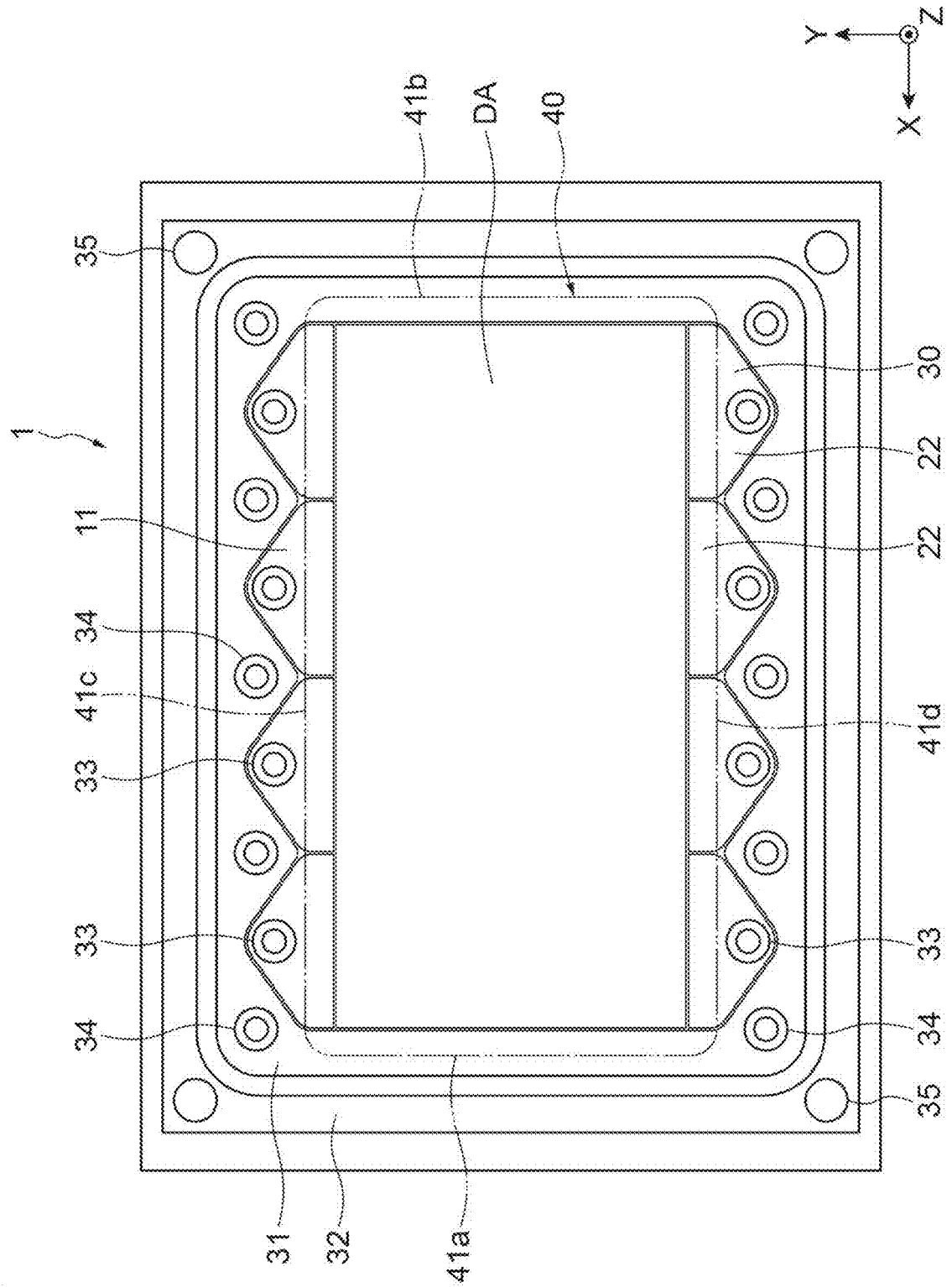
FIG. 3 is a plan view of the avalanche photodiode array.
Figure 4:
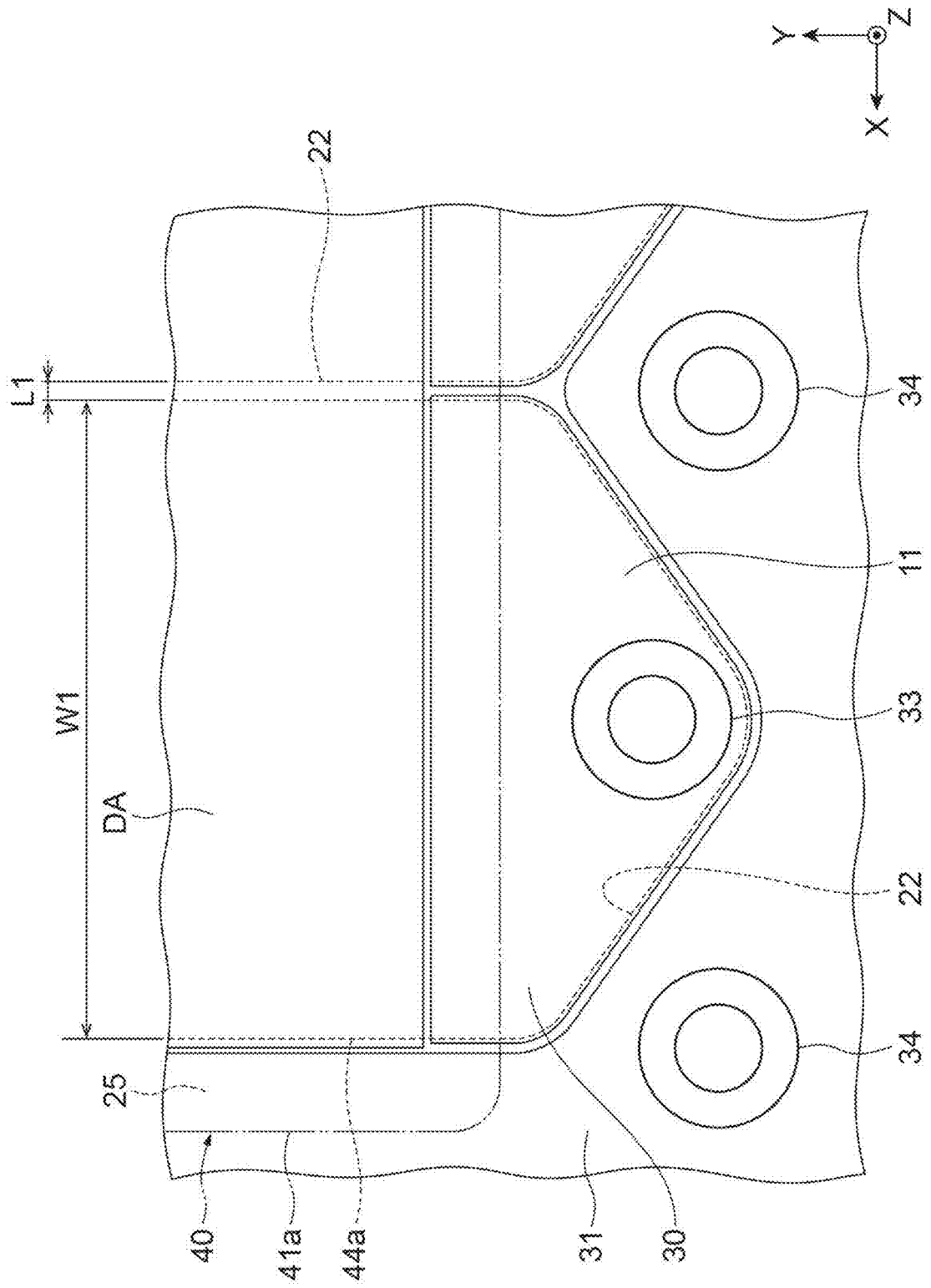
FIG. 4 is a partially enlarged view of the avalanche photodiode array.

First, the configuration of an avalanche photodiode array according to the present embodiment will be described with reference to FIGS. 1 to 4. Hereinafter, the "avalanche photodiode" will be referred to as "APD". FIG. 1 is a schematic plan view of an APD array according to the present embodiment. FIG. 2 is a cross-sectional view of the APD array. FIG. 3 is a plan view of the APD array. FIG. 4 is a partially enlarged view of the APD array. An X-axis, a Y-axis, and a Z-axis are perpendicular to each other. A direction D1 matches the Z-axis direction. A direction D2 is perpendicular to the direction D1 and parallel to the XY-axis plane. Hereinafter, the direction D1 will also be referred to as "Z-axis direction".

An APD array 1 is used to detect electromagnetic waves or particle beams. For example, the APD array 1 can be used as a photodetector for LiDAR (Light Detection and Ranging). The APD array 1 can also be used as a detector for high-energy particles, for example. In particular, the APD array 1 is used for the detection of electromagnetic waves or particle beams, which require a relatively wide sensitivity layer. For example, the electromagnetic waves detected by the APD array 1 include electromagnetic waves having wavelengths of 600 nm to 1200 nm or X-rays. The particle beams detected by the APD array 1 include, for example, high-energy particle beams such as electron beams. Hereinafter, X-rays and high-energy particle beams are also collectively referred to as "high-energy rays". In the present embodiment, the APD array 1 is of a front surface incidence type.

As shown in FIGS. 1 and 2, the APD array 1 includes a semiconductor substrate 10. As shown in FIG. 2, the semiconductor substrate 10 has a first surface 11 and a second surface 12 facing each other.

The semiconductor substrate 10 has a plurality of APDs 15. The plurality of APDs 15 are arranged along the first surface 11. As shown in FIG. 3, the APD array 1 includes a detection target area DA. The APD array 1 outputs a detection signal according to electromagnetic waves or particles incident on the detection target area DA. Each APD 15 operates in a linear mode.

In the present embodiment, each APD 15 is of a front surface incidence type in which detection light is incident from the first surface 11. That is, in the present embodiment, the first surface 11 corresponds to the incidence surface. The Z-axis is perpendicular to the first surface 11. The X-axis and the Y-axis extend along the first surface 11.

As shown in FIG. 2, the semiconductor substrate 10 includes a semiconductor region 20 provided on the first surface 11 side. The semiconductor region 20 is of a first conductivity type. In the present embodiment, the semiconductor region 20 forms a part of the first surface 11. The semiconductor substrate 10 further includes a first semiconductor layer 21, a plurality of second semiconductor layers 22, and a multiplication layer 40. The plurality of APDs 15 include the first semiconductor layer 21, the plurality of second semiconductor layers 22, and the multiplication layer 40 that are provided within the semiconductor substrate 10. The first semiconductor layer 21 is of the first conductivity type. The plurality of second semiconductor layers 22 are of a second conductivity type.

The first semiconductor layer 21 is provided closer to the second surface 12 than the semiconductor region 20. The first semiconductor layer 21 is provided along the second surface 12. In the present embodiment, the first semiconductor layer 21 forms the second surface 12. The first semiconductor layer 21 is in contact with the semiconductor region 20 within the semiconductor substrate 10. When viewed in the Z-axis direction, the plurality of second semiconductor layers 22 and the multiplication layer 40 are provided within a range where the first semiconductor layer 21 is located. In the present embodiment, the first semiconductor layer 21 corresponds to an anode.

The plurality of second semiconductor layers 22 are arranged along the first surface 11. Each second semiconductor layer 22 forms a part of the first surface 11. Each second semiconductor layer 22 is surrounded by the semiconductor region 20 when viewed in the Z-axis direction. In the present embodiment, each second semiconductor layer 22 is in contact with the semiconductor region 20 on a surface other than a surface forming the first surface 11. When viewed in the Z-axis direction, the semiconductor region 20 is provided between the second semiconductor layers 22 adjacent to each other. Each second semiconductor layer 22 corresponds to a channel layer that outputs the detection signal of each APD 15.

As shown in FIG. 1, when viewed in the Z-axis direction, a portion of each second semiconductor layer 22 overlapping the multiplication layer 40 has, for example, a rectangular shape extending in the X-axis direction. In this specification, "overlapping" is not limited to cases where the contours of each other match, but includes cases where at least parts of each other overlap. When viewed in the Z-axis direction, a portion of each second semiconductor layer 22 overlapping the detection target area DA has, for example, a rectangular shape extending in the X-axis direction. In this specification, the "rectangular shape" also includes a shape with rounded corners. When viewed in the Z-axis direction, the width W1 of each second semiconductor layer 22 is greater than a shortest distance L1 between the second semiconductor layers 22 adjacent to each other. When viewed in the Z-axis direction, the width W1 of each second semiconductor layer 22 is, for example, greater than 10 μm. The width W1 of the second semiconductor layer 22 is, for example, a length in a direction along the X-axis direction.

The multiplication layer 40 multiplies carriers. The multiplication layer 40 is provided within the semiconductor region 20. The multiplication layer 40 is provided between the plurality of second semiconductor layers 22 and the first semiconductor layer 21 in the Z-axis direction. The multiplication layer 40 is provided, for example, within a range of 10 μm or less from the first surface 11 in the Z-axis direction. The multiplication layer 40 may be provided within a range of 1 μm or more and 10 μm or less from the first surface 11 in the Z-axis direction.

The multiplication layer 40 has, for example, a rectangular shape. The multiplication layer 40 extends, for example, in the X-axis direction. When viewed in the Z-axis direction, the multiplication layer 40 includes a pair of edges 41a and 41b facing each other in the X-axis direction and edges 41c and 41d facing each other in the Y-axis direction.

In the front surface incidence type APD array 1, when a plurality of second semiconductor layers 22 are two-dimensionally arranged in a matrix, the plurality of second semiconductor layers 22 are arranged in two or less columns in the row direction or column direction. In the present embodiment, as shown in FIG. 1, the plurality of second semiconductor layers 22 are arranged in two or less rows in the Y-axis direction. Three or more of the plurality of second semiconductor layers 22 are arranged in the X-axis direction. The plurality of second semiconductor layers 22 are arranged in two or less rows and three or more columns. In the configuration shown in FIG. 1, the plurality of second semiconductor layers 22 are arranged in two rows and four columns.

When viewed in the Z-axis direction, the plurality of second semiconductor layers 22 are located between the pair of edges 41a and 41b in the X-axis direction. In other words, when viewed in the Z-axis direction, the pair of edges 41a and 41b of the multiplication layer 40 are located outside the edge 44a of the second semiconductor layer 44 located at the outermost position in the X-axis direction among the plurality of second semiconductor layers 22. When the plurality of second semiconductor layers 22 are arranged in two or less rows and three or more columns, the multiplication layer 40 is arranged so as to stretch across the plurality of second semiconductor layers 22 when viewed in the Z-axis direction.

In this case, in the plurality of second semiconductor layers 22, the area of a region where each second semiconductor layer 22 and the multiplication layer 40 overlap each other when viewed in the Z-axis direction is the same. "The same" includes manufacturing tolerances. The detection target area DA is located within a range where the multiplication layer 40 is located. When viewed in the Z-axis direction, each second semiconductor layer 22 extends further in the Y-axis direction than the edges 41c and 41d of the multiplication layer 40.

As shown in FIG. 2, the multiplication layer 40 includes a third semiconductor layer 23 and a fourth semiconductor layer 24 facing each other. The third semiconductor layer 23 is provided closer to the first surface 11 than the fourth semiconductor layer 24. The fourth semiconductor layer 24 is provided closer to the second surface 12 than the third semiconductor layer 23. The third semiconductor layer 23 is of the second conductivity type. The fourth semiconductor layer 24 is of the first conductivity type.

In the present embodiment, the multiplication layer 40 further includes the semiconductor region 20 located between the third semiconductor layer 23 and the fourth semiconductor layer 24. The third semiconductor layer 23 and the fourth semiconductor layer 24 face each other with the semiconductor region 20 interposed therebetween, and are spaced apart from each other. As a modification example of the present embodiment, the multiplication layer 40 may not include the semiconductor region 20. In this modification example, the third semiconductor layer 23 and the fourth semiconductor layer 24 are connected to each other.

The multiplication layer 40 is continuously provided so as to overlap the plurality of second semiconductor layers 22 when viewed in the Z-axis direction. In other words, when viewed in the Z-axis direction, a single region surrounded by the edges 41a, 41b, 41c, and 41d of the multiplication layer 40 overlaps the plurality of second semiconductor layers 22. Each of the third semiconductor layer 23 and the fourth semiconductor layer 24 included in the multiplication layer 40 is provided so as to overlap the plurality of second semiconductor layers 22 when viewed in the Z-axis direction. Each of the third semiconductor layer 23 and the fourth semiconductor layer 24 included in the multiplication layer 40 is continuously provided. The third semiconductor layer 23 and the fourth semiconductor layer 24 are provided so as to overlap each other when viewed in the Z-axis direction. Both of one third semiconductor layer 23 and one fourth semiconductor layer 24 face the plurality of second semiconductor layers 22 in the Z-axis direction.

In the present embodiment, the edges 41a, 41b, 41c, and 41d of the multiplication layer 40 match the edges of the third semiconductor layer 23 when viewed in the Z-axis direction. When viewed in the Z-axis direction, the edges 41a, 41b, 41c, and 41d of the multiplication layer 40 match the edges of the fourth semiconductor layer 24. In the present embodiment, each second semiconductor layer 22 includes a portion not overlapping the multiplication layer 40 when viewed in the Z-axis direction. For example, when viewed in the Z-axis direction, the area of a region where the multiplication layer 40 and the plurality of second semiconductor layers 22 overlap each other is 80% or more of the area of a region where the multiplication layer 40 is located.

The semiconductor substrate 10 further includes a fifth semiconductor layer 25. The fifth semiconductor layer 25 surrounds the entire region where the plurality of second semiconductor layers 22 are arranged when viewed in the Z-axis direction. The fifth semiconductor layer 25 forms a part of the first surface 11. The fifth semiconductor layer 25 is surrounded by the semiconductor region 20. The fifth semiconductor layer 25 is in contact with the semiconductor region 20 on a surface other than a surface forming the first surface 11. The fifth semiconductor layer 25 is of the second conductivity type.

When viewed in the Z-axis direction, the multiplication layer 40 and the fifth semiconductor layer 25 overlap each other at least in part. When viewed in the Z-axis direction, the third semiconductor layer 23 and the fifth semiconductor layer 25 overlap each other at least in part. The fifth semiconductor layer 25 corresponds to an absorption layer that absorbs carriers generated outside the detection target area DA.

The semiconductor substrate 10 further includes a plurality of sixth semiconductor layers 26. Each sixth semiconductor layer 26 is of the first conductivity type. The plurality of sixth semiconductor layers 26 are arranged on the first surface 11. Each sixth semiconductor layer 26 forms a part of the first surface 11. Each sixth semiconductor layer 26 is surrounded by the semiconductor region 20. In the present embodiment, each sixth semiconductor layer 26 is in contact with the semiconductor region 20 on a surface other than a surface forming the first surface 11. Each sixth semiconductor layer 26 is provided between a plurality of second semiconductor layers 22 adjacent to each other when viewed in the Z-axis direction. Each sixth semiconductor layer 26 corresponds to a separator that separates the second semiconductor layers 22 adjacent to each other to suppress the movement of carriers.

Each sixth semiconductor layer 26 overlaps the third semiconductor layer 23 when viewed in the Z-axis direction. The thickness of each sixth semiconductor layer 26 in the Z-axis direction is smaller than the thickness of each second semiconductor layer 22. Each sixth semiconductor layer 26 and third semiconductor layer 23 are spaced apart from each other. The shortest distance between each sixth semiconductor layer 26 and the third semiconductor layer 23 in the Z-axis direction is, for example, 1 μm or more. The semiconductor region 20 is provided between each sixth semiconductor layer 26 and the third semiconductor layer 23. The width of each sixth semiconductor layer 26 in a direction along the first surface 11 is, for example, 8 μm or less.

The semiconductor substrate 10 further includes a semiconductor electrode layer 45. The semiconductor electrode layer 45 surrounds the entire region where the plurality of second semiconductor layers 22 are arranged and the entire fifth semiconductor layer 25 when viewed in the Z-axis direction. The semiconductor electrode layer 45 forms a part of the first surface 11. The semiconductor electrode layer 45 is surrounded by the semiconductor region 20. The semiconductor electrode layer 45 is in contact with the semiconductor region 20 on a surface other than a surface forming the first surface 11. The semiconductor electrode layer 45 is of the first conductivity type. When viewed in the Z-axis direction, the multiplication layer 40 and the semiconductor electrode layer 45 do not overlap each other. The semiconductor electrode layer 45 is electrically connected to the first semiconductor layer 21.

The semiconductor substrate 10 is formed of, for example, a silicon semiconductor. In this case, the semiconductor substrate 10 contains silicon. In this case, the first conductivity type is P-type, and the second conductivity type is N-type. In the semiconductor substrate 10, the first semiconductor layer 21 and the fourth semiconductor layer 24, which are P-type semiconductor layers, are doped with, for example, a group III element as an impurity. Examples of the P-type impurity include at least one selected from boron, gallium, and indium. The second semiconductor layer 22 and the third semiconductor layer 23, which are N-type semiconductor layers, are doped with, for example, a group V element as an impurity. Examples of the N-type impurity include at least one selected from phosphorus, arsenic, and antimony.

Impurities are doped, for example, by ion implantation or thermal diffusion. In the present embodiment, the plurality of second semiconductor layers 22, the third semiconductor layer 23, the fourth semiconductor layer 24, the fifth semiconductor layer 25, and the semiconductor electrode layer 45 are formed by impurity doping using ion implantation.

As a modification example of the present embodiment, the semiconductor substrate 10 may be formed of, for example, a compound semiconductor. In this case, the semiconductor substrate 10 may contain indium phosphide. The first conductivity type is N-type, and the second conductivity type is P-type. In the semiconductor substrate 10, the N-type semiconductor layer is doped with, for example, a group IV or group VI element as an impurity. Examples of the N-type impurity include at least one selected from silicon, tin, sulfur, selenium, and tellurium. The P-type semiconductor layer is doped with, for example, a group II element as an impurity. Examples of the P-type impurity include at least one selected from beryllium and zinc.

The amount of impurities doped in each of the semiconductor region 20, the first semiconductor layer 21, the second semiconductor layer 22, the third semiconductor layer 23, the fourth semiconductor layer 24, the fifth semiconductor layer 25, and the semiconductor electrode layer 45 satisfies the following relationship indicated by the impurity concentration, for example. The impurity concentration of the first semiconductor layer 21 and the impurity concentration of the fourth semiconductor layer 24 are, for example, equal to or higher than the impurity concentration of the semiconductor region 20, and more preferably higher than the impurity concentration of the semiconductor region 20. The impurity concentration of the first semiconductor layer 21 is, for example, equal to or higher than the impurity concentration of the fourth semiconductor layer 24, and more preferably higher than the impurity concentration of the fourth semiconductor layer 24. The impurity concentration of each second semiconductor layer 22 is, for example, equal to or higher than the impurity concentration of the third semiconductor layer 23, and more preferably higher than the impurity concentration of the third semiconductor layer 23. The impurity concentration of the third semiconductor layer 23 is, for example, equal to or higher than the impurity concentration of the fourth semiconductor layer 24, and more preferably higher than the impurity concentration of the fourth semiconductor layer 24. The impurity concentration of the sixth semiconductor layer 26 is equal to or higher than the impurity concentration of the semiconductor region 20, and more preferably higher than the impurity concentration of the semiconductor region 20. The impurity concentration of the fifth semiconductor layer 25 is, for example, the same as that of each second semiconductor layer 22. The impurity concentration of the semiconductor electrode layer 45 is, for example, the same as that of the first semiconductor layer 21. "Impurity concentration" means the amount of doped impurities per unit volume. The impurity concentration is also called charge carrier concentration or majority carrier concentration.

As a modification example of the present embodiment, the amount of impurities doped in each of the semiconductor region 20, the first semiconductor layer 21, the second semiconductor layer 22, the third semiconductor layer 23, the fourth semiconductor layer 24, the fifth semiconductor layer 25, and the semiconductor electrode layer 45 may be compared not by the impurity concentration but by the total amount of impurities in the Z-axis direction. The total amount of impurities in the Z-axis direction can be calculated by, for example, line integration in the Z-axis direction of the impurity concentration at any position from the first surface 11 in the Z-axis direction. The section length for line integration is, for example, the thickness of the target region in the Z-axis direction. Hereinafter, the value obtained by this line integration will be referred to as an "impurity integration amount".

For example, assuming that the any position from the first surface 11 in the Z-axis direction is "x", the impurity concentration of the third semiconductor layer 23 at the any position "x" is "f(x)", the impurity concentration of the fourth semiconductor layer 24 at the any position "x" is "g(x)", the thickness of the third semiconductor layer 23 in the Z-axis direction is "$L_\alpha$", the thickness of the fourth semiconductor layer 24 in the Z-axis direction is "$L_\beta$", the shortest distance between the first surface 11 and the third semiconductor layer 23 in the Z-axis direction is "A", and the shortest distance between the first surface 11 and the fourth semiconductor layer 24 in the Z-axis direction is "B", the following Equation (2) is satisfied.

[Equation 2]

$$\int_A^{A+L_\alpha} f(x)\,dx \geq \int_B^{B+L_\beta} g(x)\,dx \qquad (2)$$

That is, the impurity integration amount of the third semiconductor layer 23 is, for example, equal to or greater than the impurity integration amount of the fourth semiconductor layer 24. More preferably, the impurity integration amount of the third semiconductor layer 23 is, for example, greater than the impurity integration amount of the fourth semiconductor layer 24.

The amount of impurities doped in each of the semiconductor region 20, the first semiconductor layer 21, the second semiconductor layer 22, the third semiconductor layer 23, the fourth semiconductor layer 24, the fifth semiconductor layer 25, and the semiconductor electrode layer 45 satisfies the following relationship in the above impurity integration amount. The impurity integration amount of the first semiconductor layer 21 and the impurity integration amount of the fourth semiconductor layer 24 are, for example, equal to or greater than the impurity integration amount of the semiconductor region 20, and more preferably greater than the impurity integration amount of the semiconductor region 20. The impurity integration amount of the first semiconductor layer 21 is, for example, equal to or greater than the impurity integration amount of the fourth semiconductor layer 24, and more preferably greater than the impurity integration amount of the fourth semiconductor layer 24. The impurity integration amount of each second semiconductor layer 22 is, for example, equal to or greater than the impurity integration amount of the third semiconductor layer 23, and more preferably greater than the impurity integration amount of the third semiconductor layer 23. The impurity integration amount of the sixth semiconductor layer 26 is, for example, equal to or greater than the impurity integration amount of the semiconductor region 20, and more preferably greater than the impurity integration amount of the semiconductor region 20. The impurity integration amount of the fifth semiconductor layer 25 is, for example, the same as that of each second semiconductor layer 22. The impurity integration amount of the semiconductor electrode layer 45 is, for example, greater than that of the first semiconductor layer 21.

In the present embodiment, as shown in FIGS. 1 and 3, the APD array 1 further includes a plurality of metal layers 30, 31, and 32 and a plurality of pad electrodes 33, 34, and 35. The plurality of metal layers 30, 31, and 32 and the plurality of pad electrodes 33, 34, and 35 are all provided on the first surface 11.

The plurality of metal layers 30 partially cover the plurality of second semiconductor layers 22 when viewed in the Z-axis direction. The plurality of metal layers 30 are spaced apart from each other. The plurality of metal layers 30 are in contact with different second semiconductor layers 22. Each metal layer 30 applies an electric potential to the second semiconductor layer 22 with which the metal layer 30 is in contact.

The metal layer 31 surrounds the plurality of second semiconductor layers 22 when viewed in the Z-axis direction. As shown in FIG. 2, the metal layer 31 overlaps the fifth semiconductor layer 25 when viewed in the Z-axis direction. The metal layer 31 is continuously provided along the fifth semiconductor layer 25. The metal layer 31 is in contact with, for example, the fifth semiconductor layer 25. For example, an electric potential may be applied to the fifth semiconductor layer 25 through the metal layer 31. In this case, the fifth semiconductor layer 25 can further absorb carriers generated in the detection target area DA.

As shown in FIG. 1, the metal layer 31 overlaps the edges 41a and 41b of the multiplication layer 40 when viewed in the Z-axis direction. The edges 41a and 41b of the multiplication layer 40 are shielded from light by the metal layer 31. The metal layer 31 corresponds to a shielding member that prevents electromagnetic waves to be detected from being incident on the edges 41a, 41b, 41c, and 41d of the multiplication layer 40.

The metal layer 32 surrounds the metal layer 31 and the plurality of second semiconductor layers 22 when viewed in the Z-axis direction. When viewed in the Z-axis direction, the metal layer 32 overlaps the semiconductor electrode layer 45. The metal layer 32 is continuously provided along the semiconductor electrode layer 45. The metal layer 32 is in contact with the semiconductor electrode layer 45. An electric potential is applied to the semiconductor electrode layer 45 through the metal layer 32.

Each of the plurality of pad electrodes 33 is connected to the metal layer 30. Each of the plurality of pad electrodes 33 is electrically connected to each second semiconductor layer 22 through the metal layer 30. As shown in FIG. 3, each pad electrode 33 is provided on the first surface 11 and is in contact with the corresponding second semiconductor layer 22, among the plurality of second semiconductor layers 22, through the corresponding metal layer 30 among the plurality of metal layers 30. Each pad electrode 33 corresponds to an output terminal for outputting a detection signal from each second semiconductor layer 22. When viewed in the Z-axis direction, each pad electrode 33 is provided within a range not overlapping the multiplication layer 40. The plurality of pad electrodes 33 are arranged in the X-axis direction and connected to different second semiconductor layers 22. In the present embodiment, each pad electrode 33 corresponds to a cathode of the APD array 1.

The plurality of pad electrodes 34 are connected to the metal layer 31. In the present embodiment, each pad electrode 34 corresponds to a cathode of the APD array 1. The plurality of pad electrodes 35 are connected to the metal layer 32. In the present embodiment, the pad electrode 35, the metal layer 32, the semiconductor electrode layer 45, and the first semiconductor layer 21 correspond to the anode of the APD array 1.

As shown in FIG. 2, each APD 15 includes a branch layer 51, an electric field relaxation layer 52, a high electric field layer 53, an electric field control layer 54, and a sensitivity layer 55 formed in the semiconductor substrate 10. The branch layer 51, the electric field relaxation layer 52, the high electric field layer 53, the electric field control layer 54, and the sensitivity layer 55 are arranged in order from the first surface 11 toward the second surface 12.

The branch layer 51 includes the second semiconductor layer 22 and the semiconductor region 20. The branch layer 51 is located in a region from the first surface 11 to a boundary B1 between the semiconductor region 20 and the third semiconductor layer 23 on the first surface 11 side. As a modification example of the present embodiment, the second semiconductor layer 22 may be in contact with the third semiconductor layer 23. In this case, the branch layer 51 includes the second semiconductor layer 22, and the boundary B1 is a boundary between the second semiconductor layer 22 and the third semiconductor layer 23.

The electric field relaxation layer 52, the high electric field layer 53, and the electric field control layer 54 correspond to the multiplication layer 40. In other words, in the present embodiment, the multiplication layer 40 includes the electric field relaxation layer 52, the high electric field layer 53, and the electric field control layer 54. The electric field relaxation layer 52 relieves the electric field strength in the branch layer 51. The electric field relaxation layer 52 includes the third semiconductor layer 23. The electric field relaxation layer 52 is located in a region from the boundary B1 to a boundary B2 between the semiconductor region 20 and the third semiconductor layer 23 on the second surface 12 side.

The high electric field layer 53 is a layer to which a higher electric field strength than other semiconductor layers is applied during operation. The high electric field layer 53 corresponds to a carrier multiplication layer that multiplies carriers at a higher electric field strength than other semiconductor layers. The high electric field layer 53 includes the semiconductor region 20. The high electric field layer 53 is located in a region from the boundary B2 to a boundary B3 between the semiconductor region 20 and the fourth semiconductor layer 24.

The electric field control layer 54 controls the electric field strength in the high electric field layer 53. The electric field control layer 54 includes the fourth semiconductor layer 24. The electric field control layer 54 is located in a region from the boundary B3 to a boundary B4 between the semiconductor region 20 and the fourth semiconductor layer 24 on the second surface 12 side.

The multiplication layer 40 is located in a region from the boundary B1 to the boundary B4. As a modification example of the present embodiment, when the semiconductor region 20 is not provided between the third semiconductor layer 23 and the fourth semiconductor layer 24, the multiplication layer 40 does not include the semiconductor region 20. In this case, the high electric field layer 53 corresponds to the boundary between the third semiconductor layer 23 and the fourth semiconductor layer 24.

The sensitivity layer 55 includes the semiconductor region 20. The sensitivity layer 55 is located in a region from the boundary B4 to a boundary B5 between the semiconductor region 20 and the first semiconductor layer 21. In the Z-axis direction, the shortest distance L11 between the first semiconductor layer 21 and the fourth semiconductor layer 24 is greater than the shortest distance L12 between the plurality of second semiconductor layers 22 and the third semiconductor layer 23. Therefore, in the Z-axis direction, the thickness of the sensitivity layer 55 is greater than the shortest distance L12 between the plurality of second semiconductor layers 22 and the third semiconductor layer 23. In the Z-axis direction, the thickness of the sensitivity layer 55 may be greater than the thickness of the branch layer 51. In the Z-axis direction, the thickness of the sensitivity layer 55 may be greater than the sum of the thickness of the branch layer 51 and the thickness of the multiplication layer 40. The thickness of the sensitivity layer 55 is, for example, 10 μm or more and 1000 μm or less. The thickness of the sensitivity layer 55 may be 20 μm or more and 80 μm or less.

When electrons or particles are incident on the sensitivity layer 55, carriers are generated in the sensitivity layer 55. The carriers generated in the sensitivity layer 55 move to the multiplication layer 40. The movement speed of the carriers generated in the sensitivity layer 55 depends on the electric field strength in the sensitivity layer 55. In the multiplication layer 40, the carriers are multiplied. The carriers multiplied in the multiplication layer 40 move to the branch layer 51. The carriers that have moved to the branch layer 51 are output from each second semiconductor layer 22.

Figure 5:
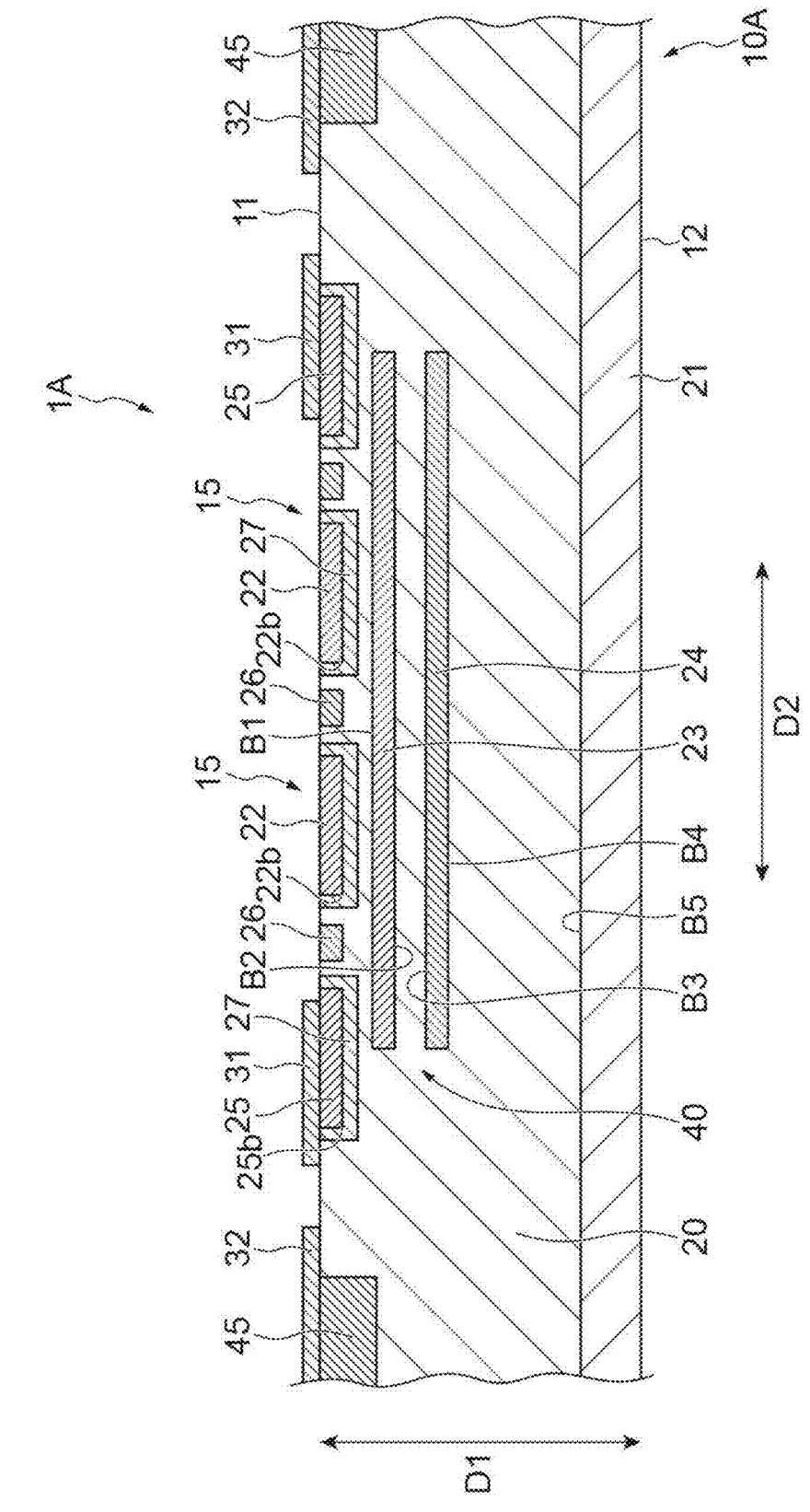
FIG. 5 is a cross-sectional view of an avalanche photodiode array according to a modification example of the present embodiment.

Next, an APD array according to a modification example of the present embodiment will be described with reference to FIG. 5. FIG. 5 is a cross-sectional view of an APD array 1A according to the modification example of the present embodiment. This modification example is generally similar to or the same as the above-described embodiment and modification examples. The APD array 1A is different from the above-described embodiment in that the APD array 1A includes a semiconductor substrate 10A instead of the semiconductor substrate 10. Hereinafter, the differences from the above-described embodiment will be mainly described.

As shown in FIG. 5, the semiconductor substrate 10A includes a plurality of junction termination extension (JTE) regions 27. Each second semiconductor layer 22 is covered by the junction termination extension region 27. When viewed in the Z-axis direction, the edge 22b of each second semiconductor layer 22 is covered by the junction termination extension region 27. In this modification example, each second semiconductor layer 22 and the semiconductor region 20 are spaced apart from each other. The junction termination extension region 27 is provided between each second semiconductor layer 22 and the semiconductor region 20. Each second semiconductor layer 22 is in contact with the junction termination extension region 27 on a surface other than a surface forming the first surface 11. In other words, a portion of each second semiconductor layer 22 facing the semiconductor region 20 is in contact with the junction termination extension region 27.

The fifth semiconductor layer 25 is covered by the junction termination extension region 27. When viewed in the Z-axis direction, the edge 25b of the fifth semiconductor layer 25 is covered by the junction termination extension region 27. In this modification example, the fifth semiconductor layer 25 and the semiconductor region 20 are spaced apart from each other. The junction termination extension region 27 is provided between the fifth semiconductor layer 25 and the semiconductor region 20. The fifth semiconductor layer 25 is in contact with the junction termination extension region 27 on a surface other than a surface forming the first surface 11. In other words, a portion of the fifth semiconductor layer 25 facing the semiconductor region 20 is in contact with the junction termination extension region 27.

In this modification example, each junction termination extension region 27 and the third semiconductor layer 23 are spaced apart from each other. The semiconductor region 20 is provided between each junction termination extension region 27 and the third semiconductor layer 23. As a further modification example of this modification example, each junction termination extension region 27 and the third semiconductor layer 23 may be in contact with each other.

As a further modification example of this modification example, the plurality of junction termination extension regions 27 may be one continuous region. In this case, for example, the plurality of second semiconductor layers 22 and the fifth semiconductor layer 25 are covered by one junction termination extension region 27.

Each junction termination extension region 27 is a second conductivity type semiconductor region. The impurity concentration of the junction termination extension region 27 is lower than the impurity concentration of the second semiconductor layer 22. For example, the impurity integration amount of the junction termination extension region 27 is smaller than the impurity integration amount of the second semiconductor layer 22.

Figure 6:
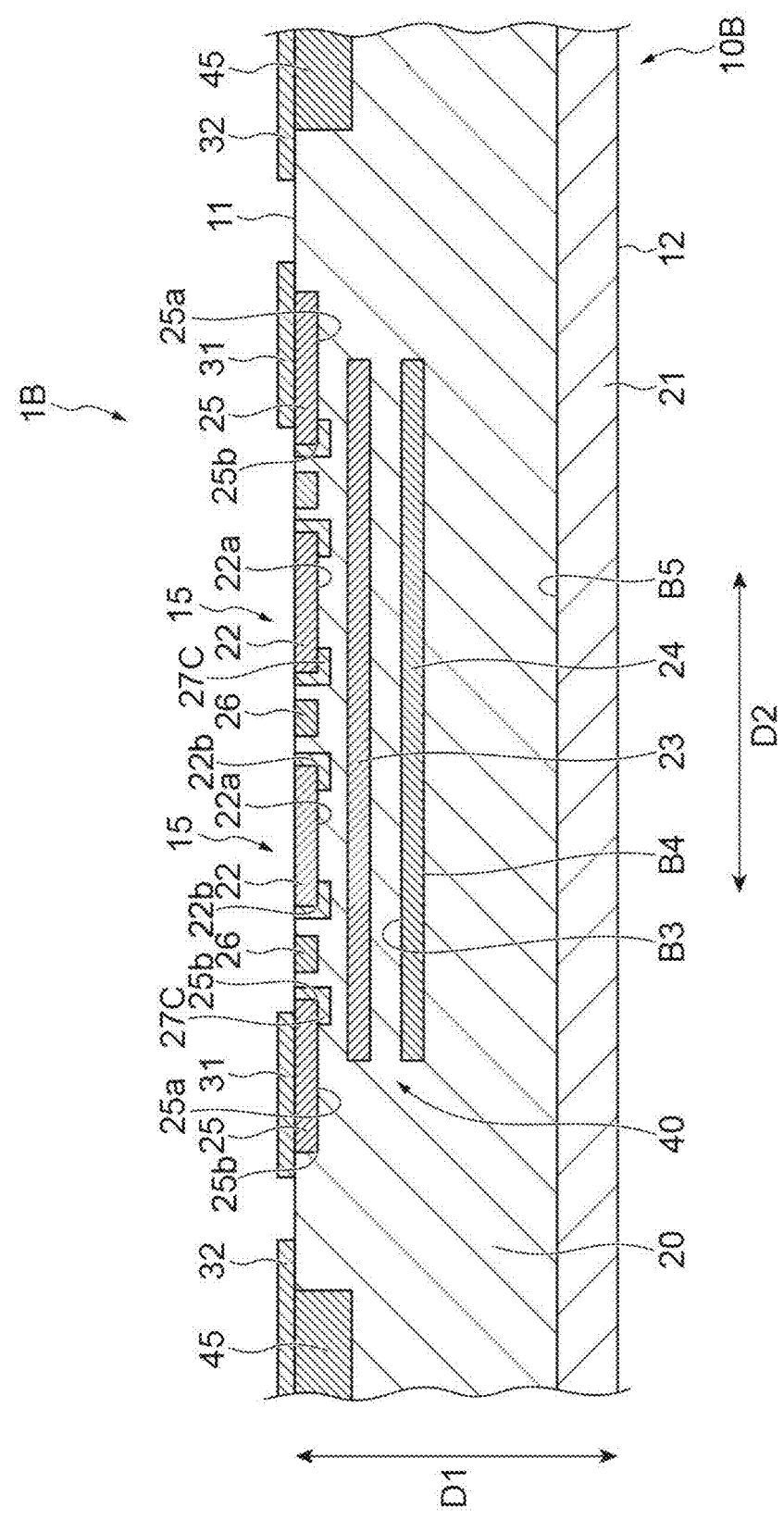
FIG. 6 is a cross-sectional view of an avalanche photodiode array according to a modification example of the present embodiment.

Next, an APD array according to a modification example of the present embodiment will be described with reference to FIG. 6. FIG. 6 is a cross-sectional view of an APD array 1B according to the modification example of the present embodiment. This modification example is generally similar to or the same as the above-described embodiment and modification examples. The APD array 1B is different from the configuration shown in FIG. 5 in that the APD array 1B includes a semiconductor substrate 10B instead of the semiconductor substrate 10A. Hereinafter, the differences from the configuration shown in FIG. 5 will be mainly described.

As shown in FIG. 6, the semiconductor substrate 10B is different from the semiconductor substrate 10A in that the semiconductor substrate 10B includes a plurality of junction termination extension regions 27C instead of the plurality of junction termination extension regions 27. When viewed in the Z-axis direction, the edge 22b of each second semiconductor layer 22 is covered by the junction termination extension region 27C. The junction termination extension region 27C is provided between the edge 22b of each second semiconductor layer 22 and the semiconductor region 20. Each second semiconductor layer 22 is in contact with the semiconductor region 20 at a portion other than the edge 22b. For example, in each second semiconductor layer 22, at least a part of a surface 22a facing the first surface 11 is in contact with the semiconductor region 20. The edge 22b of each second semiconductor layer 22 includes the edge of the surface 22a of each second semiconductor layer 22 facing the first surface 11.

When viewed in the Z-axis direction, the edge 25b of the fifth semiconductor layer 25 is covered by the junction termination extension region 27C. The junction termination extension region 27C is provided between the edge 25b of the fifth semiconductor layer 25 and the semiconductor region 20. A portion of the fifth semiconductor layer 25 other than the edge 25b is in contact with the semiconductor region 20. For example, in the fifth semiconductor layer 25, at least a part of a surface 25a facing the first surface 11 is in contact with the semiconductor region 20. The edge 25b of the fifth semiconductor layer 25 includes the edge of the surface 25a of the fifth semiconductor layer 25 facing the first surface 11.

In this modification example, the junction termination extension region 27C is provided at the edge 25b on the second semiconductor layer 22 side, among the edges 25b of the fifth semiconductor layer 25, and the junction termination extension region 27C is not provided at the edge 25b on the semiconductor electrode layer 45 side. In a modification example of this modification example, the junction termination extension region 27C may be provided at both the edge 25b on the second semiconductor layer 22 side and the edge 25b on the semiconductor electrode layer 45 side in the fifth semiconductor layer 25.

In this modification example, each junction termination extension region 27C and the third semiconductor layer 23 are spaced apart from each other. The semiconductor region 20 is provided between each junction termination extension region 27C and the third semiconductor layer 23. As a further modification example of this modification example, each junction termination extension region 27C and the third semiconductor layer 23 may be in contact with each other.

Each junction termination extension region 27C is a second conductivity type semiconductor region. The impurity concentration of the junction termination extension region 27C is lower than the impurity concentration of the second semiconductor layer 22. For example, the impurity integration amount of the junction termination extension region 27C is smaller than the impurity integration amount of the second semiconductor layer 22.

Figure 7:
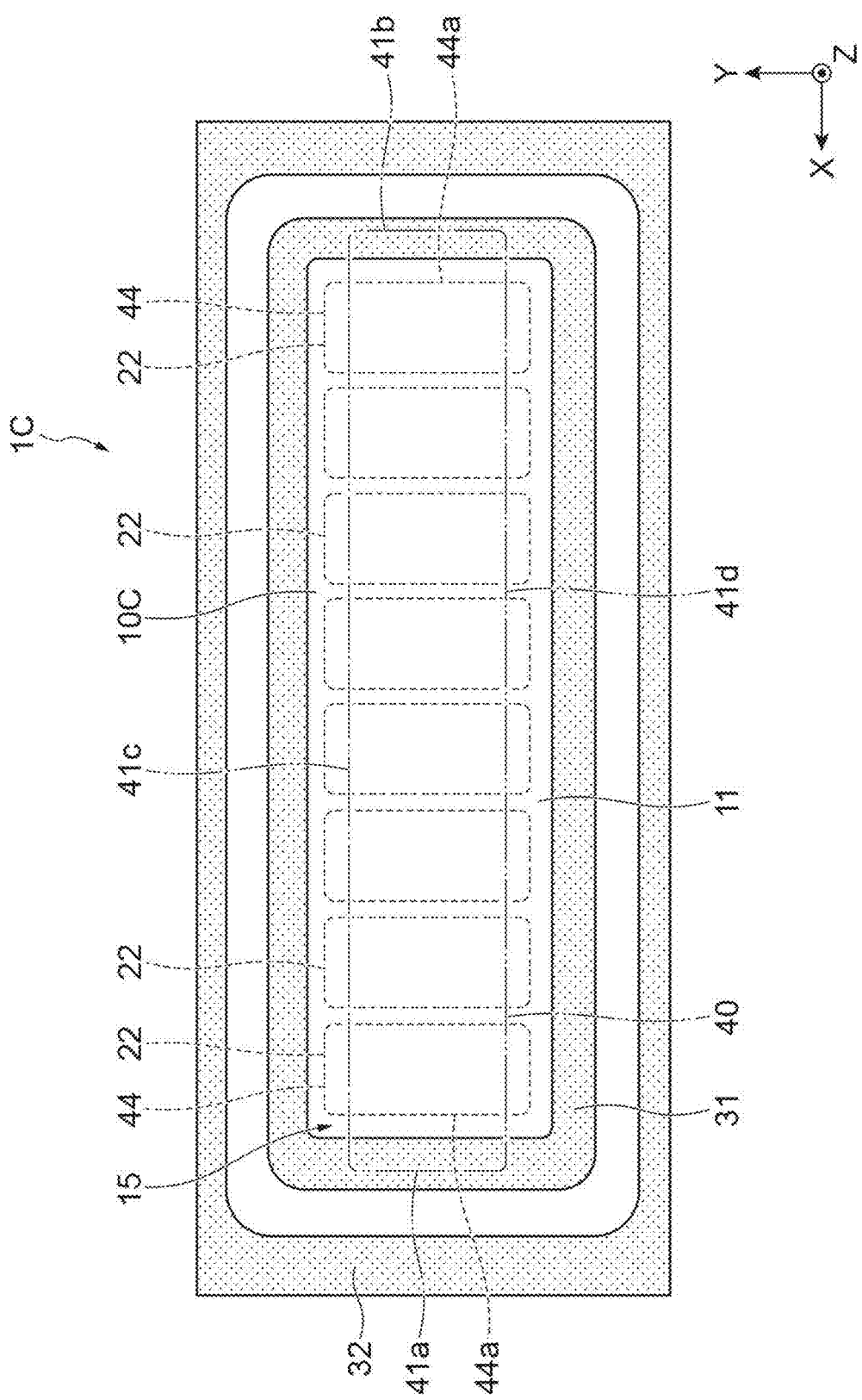
FIG. 7 is a schematic plan view of an avalanche photodiode array that is a modification example of the present embodiment.

Next, an APD array according to a modification example of the present embodiment will be described with reference to FIG. 7. FIG. 7 is a schematic plan view of an APD array 1C according to a modification example of the present embodiment. This modification example is generally similar to or the same as the above-described embodiment and modification examples. This modification example is different from the above-described embodiment in terms of the positional relationship between the plurality of second semiconductor layers 22 and the multiplication layer 40. Hereinafter, the differences from the above-described embodiment will be mainly described.

In a semiconductor substrate 10C of the APD array 1C, a plurality of second semiconductor layers 22 are arranged in one row, and three or more second semiconductor layers 22 are arranged in the X-axis direction. In other words, in the APD array 1C, the plurality of second semiconductor layers 22 are arranged in two or less rows and three or more columns. In the APD array 1C, the plurality of second semiconductor layers 22 are arranged in one row and eight columns.

In the APD array 1C as well, the multiplication layer 40 has a rectangular shape. The multiplication layer 40 extends in the X-axis direction. When viewed in the Z-axis direction, the plurality of second semiconductor layers 22 are located between the pair of edges 41a and 41b in the X-axis direction. In other words, when viewed in the Z-axis direction, the pair of edges 41a and 41b of the multiplication layer 40 are located outside the edge 44a of the second semiconductor layer 44 located at the outermost position in the X-axis direction among the plurality of second semiconductor layers 22. In other words, when viewed in the Z-axis direction, the multiplication layer 40 is arranged so as to stretch across the plurality of second semiconductor layers 22. In this case, when viewed in the Z-axis direction, in the plurality of second semiconductor layers 22, the area of a region where each second semiconductor layer 22 and the multiplication layer 40 overlap each other is the same. When viewed in the Z-axis direction, each second semiconductor layer 22 extends further in the Y-axis direction than the edges 41c and 41d of the multiplication layer 40. When viewed in the Z-axis direction, the multiplication layer 40 and the fifth semiconductor layer 25 overlap each other at least in part.

Figure 8B:
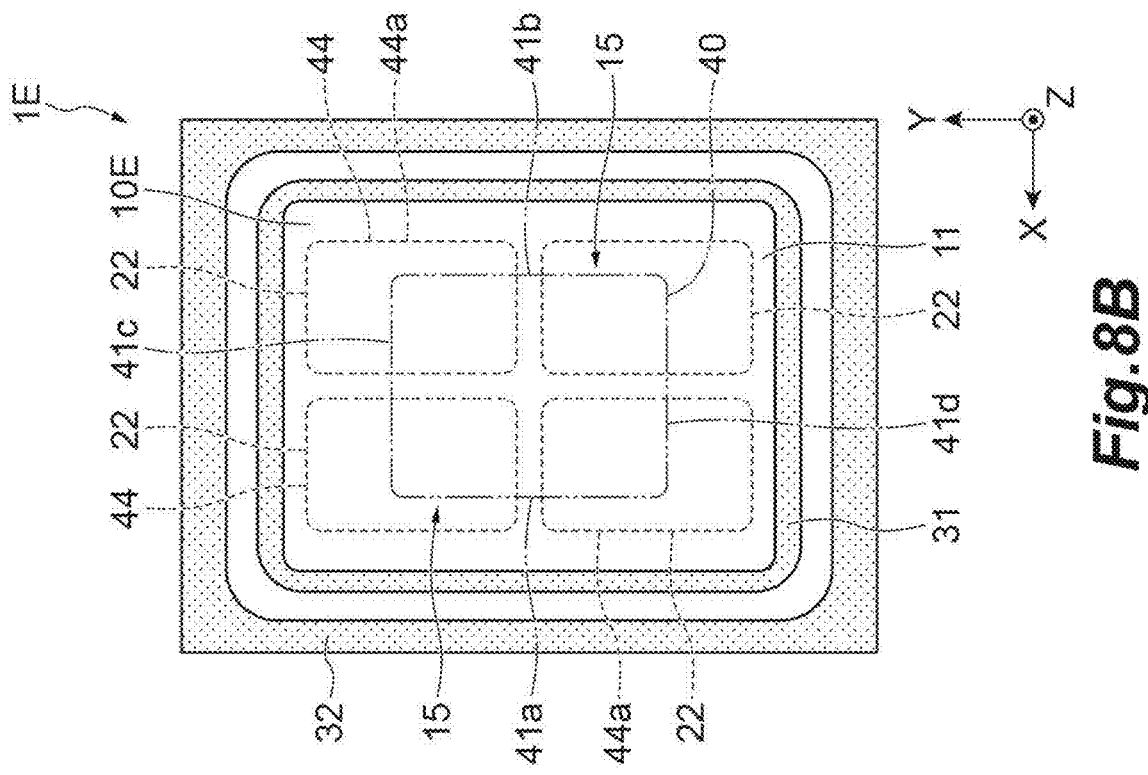
FIGS. 8(a) and 8(b) are schematic plan views of avalanche photodiode arrays that are modification examples of the present embodiment.
Figure 8A:
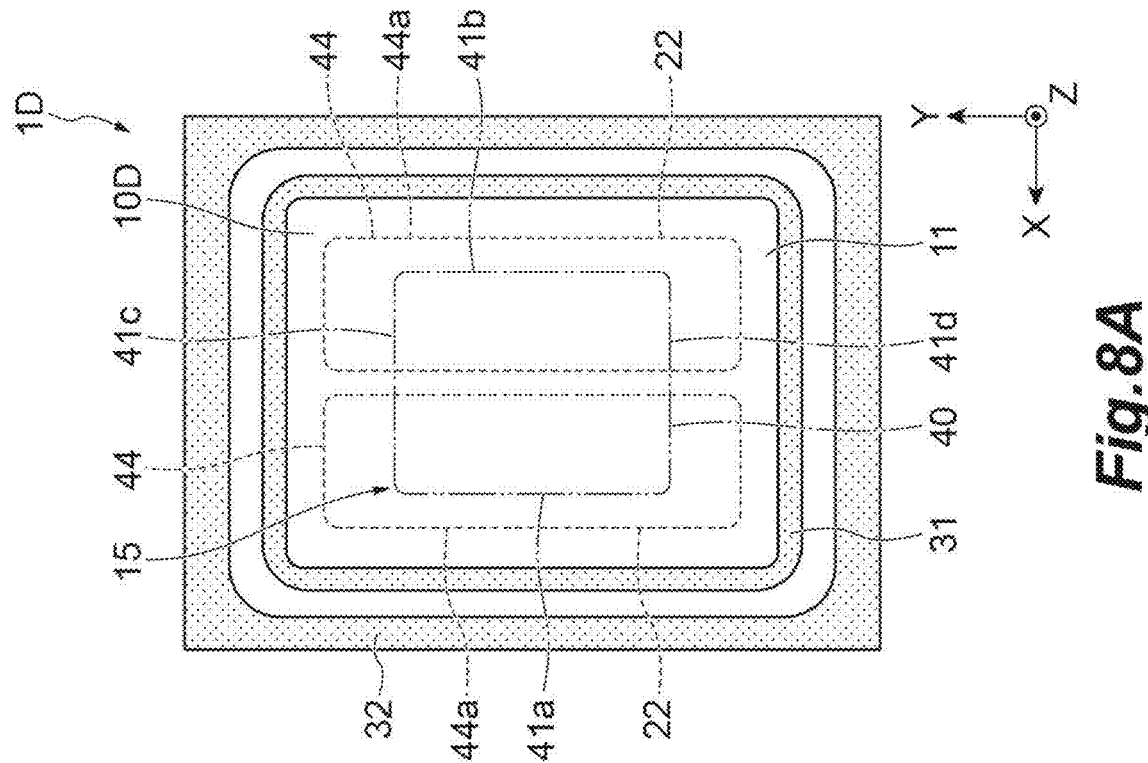

Next, an APD array according to a modification example of the present embodiment will be described with reference to FIGS. 8(a) and 8(b). FIG. 8(a) is a schematic plan view of an APD array 1D according to a modification example of the present embodiment. FIG. 8(b) is a schematic plan view of an APD array 1E according to a modification example of the present embodiment. This modification example is generally similar to or the same as the above-described embodiment and modification examples. This modification example is different from the above-described embodiment in terms of the positional relationship between the plurality of second semiconductor layers 22 and the multiplication layer 40. Hereinafter, the differences from the configurations shown in FIGS. 8(a) and 8(b) will be mainly described.

In the APD array 1D, the plurality of second semiconductor layers 22 are arranged in one row and two columns. In other words, in the APD array 1D, the plurality of second semiconductor layers 22 are arranged in two or less rows and less than three columns.

In the APD array 1D, the multiplication layer 40 has a rectangular shape. The multiplication layer 40 extends in the X-axis direction. In the APD array 1D, the multiplication layer 40 is surrounded by the fifth semiconductor layer 25 when viewed in the Z-axis direction. When viewed in the Z-axis direction, the multiplication layer 40 and the fifth semiconductor layer 25 do not overlap each other. In this case, when viewed in the Z-axis direction, in the plurality of second semiconductor layers 22, the area of a region where each second semiconductor layer 22 and the multiplication layer 40 overlap each other is the same. When viewed in the Z-axis direction, each second semiconductor layer 22 extends further in the X-axis direction and the Y-axis direction than the edges 41a, 41b, 41c, and 41d of the multiplication layer 40.

In the APD array 1E, the plurality of second semiconductor layers 22 are arranged in two rows and two columns. In other words, in the APD array 1E, the plurality of second semiconductor layers 22 are arranged in two or less rows and less than three columns.

In the APD array 1E, the multiplication layer 40 has a rectangular shape. The multiplication layer 40 extends in the X-axis direction. In the APD array 1E, the multiplication layer 40 is surrounded by the fifth semiconductor layer 25 when viewed in the Z-axis direction. When viewed in the Z-axis direction, the multiplication layer 40 and the fifth semiconductor layer 25 do not overlap each other. In this case, when viewed in the Z-axis direction, in the plurality of second semiconductor layers 22, the area of a region where each second semiconductor layer 22 and the multiplication layer 40 overlap each other is the same. When viewed in the Z-axis direction, each second semiconductor layer 22 extends further in the X-axis direction and the Y-axis direction than the edges 41a, 41b, 41c, and 41d of the multiplication layer 40.

Figure 9:
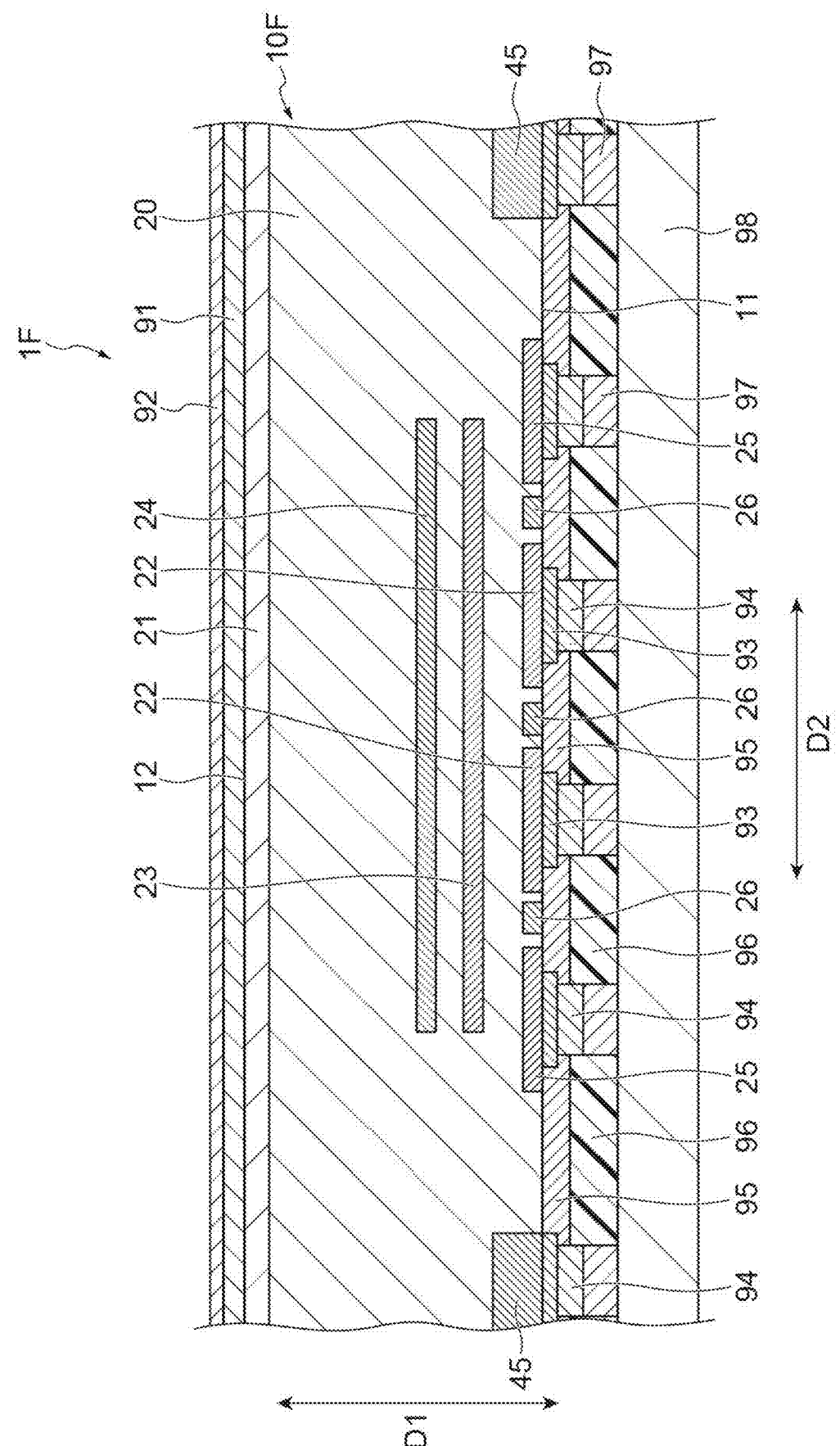
FIG. 9 is a cross-sectional view of an avalanche photodiode array according to a modification example of the present embodiment.

Next, an APD array according to a modification example of the present embodiment will be described with reference to FIG. 9. FIG. 9 is a cross-sectional view of an APD array 1F according to the modification example of the present embodiment. This modification example is generally similar to or the same as the above-described embodiment and modification examples. This modification example is different from the above-described embodiment in that the APD array is of a back surface incidence type. Hereinafter, the differences from the configuration shown in the above-described embodiment will be mainly described.

In the APD array 1F, each APD 15 is of a back surface incidence type in which detection light is incident from the second surface 12. In this modification example, the second surface 12 corresponds to the incidence surface. The Z-axis is perpendicular to the first surface 11. The APD array 1F includes a semiconductor substrate 10F. The semiconductor substrate 10F has a configuration in which the semiconductor substrate 10 of the APD array 1 shown in FIG. 5 is upside down. The APD array 1F may have, as the semiconductor substrate 10F, a configuration in which the semiconductor substrates 10A, 10B, 10C, 10D, and 10E are upside down.

In the Z-axis direction, the thickness of the first semiconductor layer 21 of the semiconductor substrate 10F is smaller than the thickness of the first semiconductor layer 21 of the semiconductor substrate 10. Only in this respect, the semiconductor substrate 10F is different from the semiconductor substrate 10. For example, the semiconductor substrate 10F is formed by removing a part of the first semiconductor layer 21 of the semiconductor substrate 10. For example, the semiconductor substrate 10F is formed by grinding the first semiconductor layer 21 of the semiconductor substrate 10A in the Z-axis direction.

In addition to the semiconductor substrate 10F, the APD array 1F includes, for example, a silicon oxide film 91, a light shielding film 92, a plurality of pad electrodes 93, a plurality of bump electrodes 94, a passivation layer 95, a resin layer 96, a solder 97, and a control board 98. The second surface 12 of the semiconductor substrate 10F is covered by the silicon oxide film 91. The second surface 12 of the semiconductor substrate 10F may be covered by a silicon nitride film instead of the silicon oxide film 91.

In this modification example, the silicon oxide film 91 is covered by the light shielding film 92. The light shielding film 92 blocks electromagnetic waves and the like other than electromagnetic waves or particle beams to be detected. The material of the light shielding film 92 may be selected depending on the electromagnetic wave or particle beam to be detected. The material of the light shielding film 92 contains, for example, aluminum. The light shielding film 92 transmits high-energy rays to be detected and blocks visible light. As a result, the detection accuracy of high-energy rays is improved. When the detection target is visible light, the APD array 1F does not need to include the light shielding film 92.

Each of the plurality of pad electrodes 93 is provided on the first surface 11 of the semiconductor substrate 10F. Each pad electrode 93 is in contact with the first surface 11 of the semiconductor substrate 10F. Each of the plurality of pad electrodes 93 is arranged so as to be in contact with one of the semiconductor electrode layer 45, the second semiconductor layer 22, and the fifth semiconductor layer 25.

Each of the plurality of bump electrodes 94 is provided on the corresponding pad electrode 93. The material of the bump electrode 94 is, for example, nickel or gold. The APD array 1F may be a direct bond instead of the bump electrode 94. The direct bond is, for example, a Cu—Cu direct bond.

The passivation layer 95 covers the first surface 11 of the semiconductor substrate 10F and the pad electrodes 93, except for a portion where each pad electrode 93 is in contact with the bump electrode 94. The material of the passivation layer 95 contains, for example, silicon nitride. The solder 97 electrically connects the control board 98 and the bump electrodes 94 to each other. The resin layer 96 is provided on the control board 98 so as to cover the bump electrodes 94 and the solder 97.

The control board 98 is electrically connected to the semiconductor substrate 10F through the solder 97, the bump electrodes 94, and the pad electrodes 93. The control board 98 applies an electric potential to the semiconductor electrode layer 45, the second semiconductor layer 22, and the fifth semiconductor layer 25 through the pad electrode 93. The control board 98 acquires a detection signal from each APD 15 of the APD array 1F and processes the detection signal. The control board 98 includes a read circuit that reads the detection signal from each APD 15. Examples of the control board 98 include an ASIC (Application Specific Integrated Circuit) or a PCB (Printed Circuit Board) board.

Figure 10:
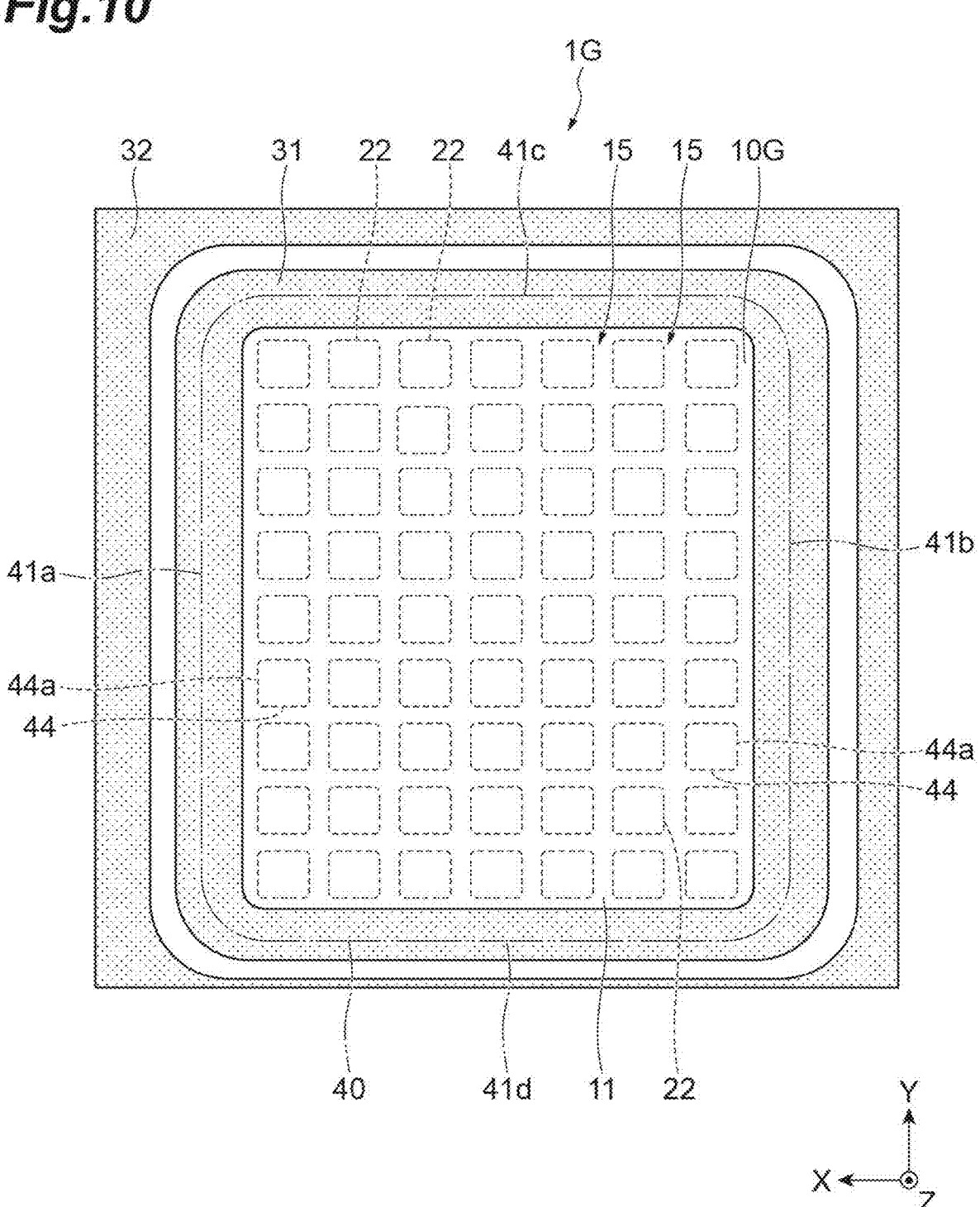
FIG. 10 is a schematic plan view of an avalanche photodiode array that is a modification example of the present embodiment.

Next, an APD array according to a modification example of the present embodiment will be described with reference to FIG. 10. FIG. 10 is a schematic plan view of an APD array 1G according to a modification example of the present embodiment. This modification example is generally similar to or the same as the above-described embodiment and modification examples. This modification example is different from the APD array 1F in terms of the positional relationship between a plurality of second semiconductor layers 22 and the multiplication layer 40. Hereinafter, the differences from the APD array 1F will be mainly described.

When the APD array is of a back surface incidence type, the plurality of second semiconductor layers 22 may be two-dimensionally arranged in a matrix so that there are three or more columns in the row and column directions. The configuration of the APD array in this case will be described with reference to FIG. 10.

In the APD array 1G, the plurality of second semiconductor layers 22 are arranged in nine rows and seven columns. Therefore, in the APD array 1G, the plurality of second semiconductor layers 22 are two-dimensionally arranged in a matrix so that there are three or more columns in the row and column directions.

In the APD array 1G as well, the multiplication layer 40 has a rectangular shape. When viewed in the Z-axis direction, the edges 41a, 41b, 41c, and 41d of the multiplication layer 40 include a pair of edges 41a and 41b facing each other in the X-axis direction and the edges 41c and 41d facing each other in the Y-axis direction.

In the APD array 1G, when viewed in the Z-axis direction, the plurality of second semiconductor layers 22 are located between the pair of edges 41a and 41b in the X-axis direction. In the Y-axis direction, the plurality of second semiconductor layers 22 are located between the pair of edges 41c and 41d. In other words, the plurality of second semiconductor layers 22 are arranged within a range where the multiplication layer 40 is located when viewed in the Z-axis direction. In other words, when viewed in the Z-axis direction, all of the edges 41a, 41b, 41c, and 41d of the multiplication layer 40 are located outside the edge 44a of the second semiconductor layer 44 located at the outermost position among the plurality of second semiconductor layers 22. In other words, when viewed in the Z-axis direction, the multiplication layer 40 is arranged so as to stretch across the plurality of second semiconductor layers 22. Also in this case, when viewed in the Z-axis direction, in the plurality of second semiconductor layers 22, the area of a region where each second semiconductor layer 22 and the multiplication layer 40 overlap each other is the same. When viewed in the Z-axis direction, the multiplication layer 40 and the fifth semiconductor layer 25 overlap each other at least in part. When viewed in the Z-axis direction, the edges 41a, 41b, 41c, and 41d of the multiplication layer 40 of the APD array 1G overlap the fifth semiconductor layer 25 around the entire circumference.

As described above, in the APD arrays 1, 1A, 1B, 1C, 1D, 1E, 1F, and 1G, the plurality of APDs 15 include the first semiconductor layer 21 of the first conductivity type, the plurality of second semiconductor layers 22 of the second conductivity type, and the multiplication layer 40. Each of the third semiconductor layer 23 and the fourth semiconductor layer 24 of the multiplication layer 40 is continuously provided so as to overlap the plurality of second semiconductor layers 22 when viewed in the Z-axis direction. In this case, carriers generated by the incidence of electromagnetic waves or particle beams to be detected are multiplied by the multiplication layer 40 that is continuously provided so as to overlap the plurality of second semiconductor layers 22. The carriers multiplied in the multiplication layer 40 are output from each second semiconductor layer 22. According to this configuration, dead areas can be reduced. For this reason, in a simple configuration without a microlens array and the like, dead areas can be reduced and desired electromagnetic waves or particle beams can be detected. According to this configuration, the sensitive layer can be relatively wide. Therefore, in particular, the detection of electromagnetic waves or high-energy rays that require a relatively wide sensitivity layer can be realized.

Figure 11A:
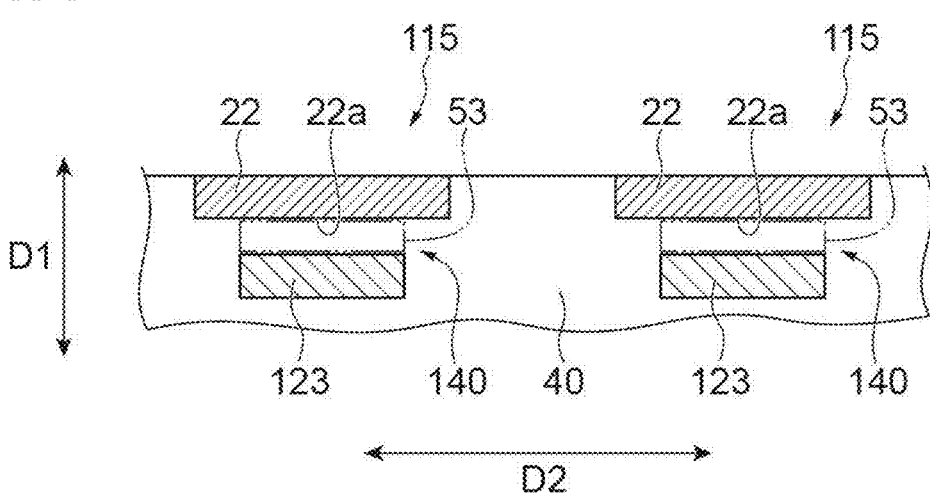
FIGS. 11(a) and 11(b) are schematic diagrams showing the configuration of a semiconductor layer in a comparative example.
Figure 11B:
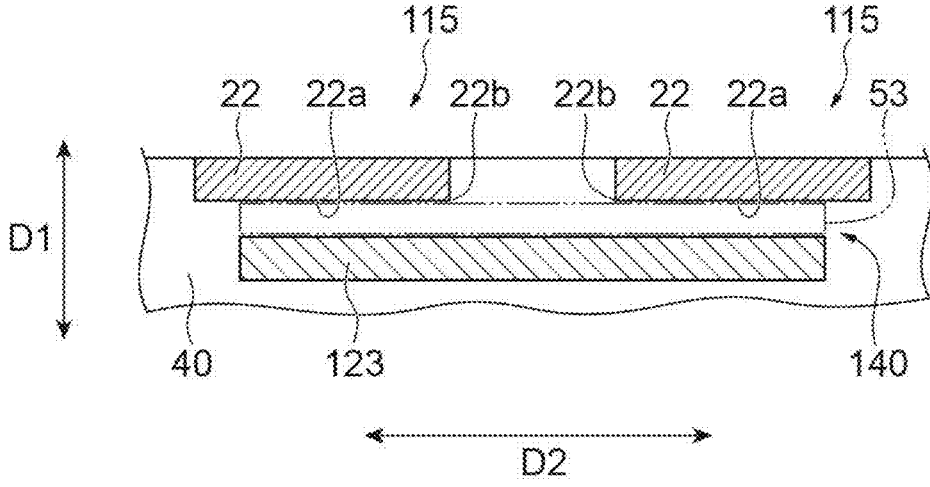

FIGS. 11(a) and 11(b) are schematic diagrams showing the configuration of a semiconductor layer in a comparative example. As shown in FIG. 11(a), when a multiplication layer is formed by a second semiconductor layer 22 of the second conductivity type and a semiconductor layer 140 of the first conductivity type for each APD 115, there was a gain variation between the APDs 115. As shown in FIG. 11(b), when one semiconductor layer 140 of the first conductivity type is formed for different second semiconductor layers 22 of the second conductivity type, the gain appears to be uniform between the APDs 115 including the different second semiconductor layers 22. However, in the configuration shown in FIG. 11(b), the high electric field layer 53 is formed between the second semiconductor layer 22 and the semiconductor layer 140. For this reason, the electric field concentrates on the edge 22b of each second semiconductor layer 22, and edge breakdown occurs between each second semiconductor layer 22 and the semiconductor layer 140.

In the APD arrays 1, 1A, 1B, 1C, 1D, 1E, 1F, and 1G, since the multiplication layer 40 is provided separately from the plurality of second semiconductor layers 22, the high electric field layer 53 and the second semiconductor layer 22 are spaced apart from each other. Therefore, since the concentration of the electric field in each second semiconductor layer 22 is suppressed, edge breakdown in each second semiconductor layer 22 is also suppressed.

Figure 12:
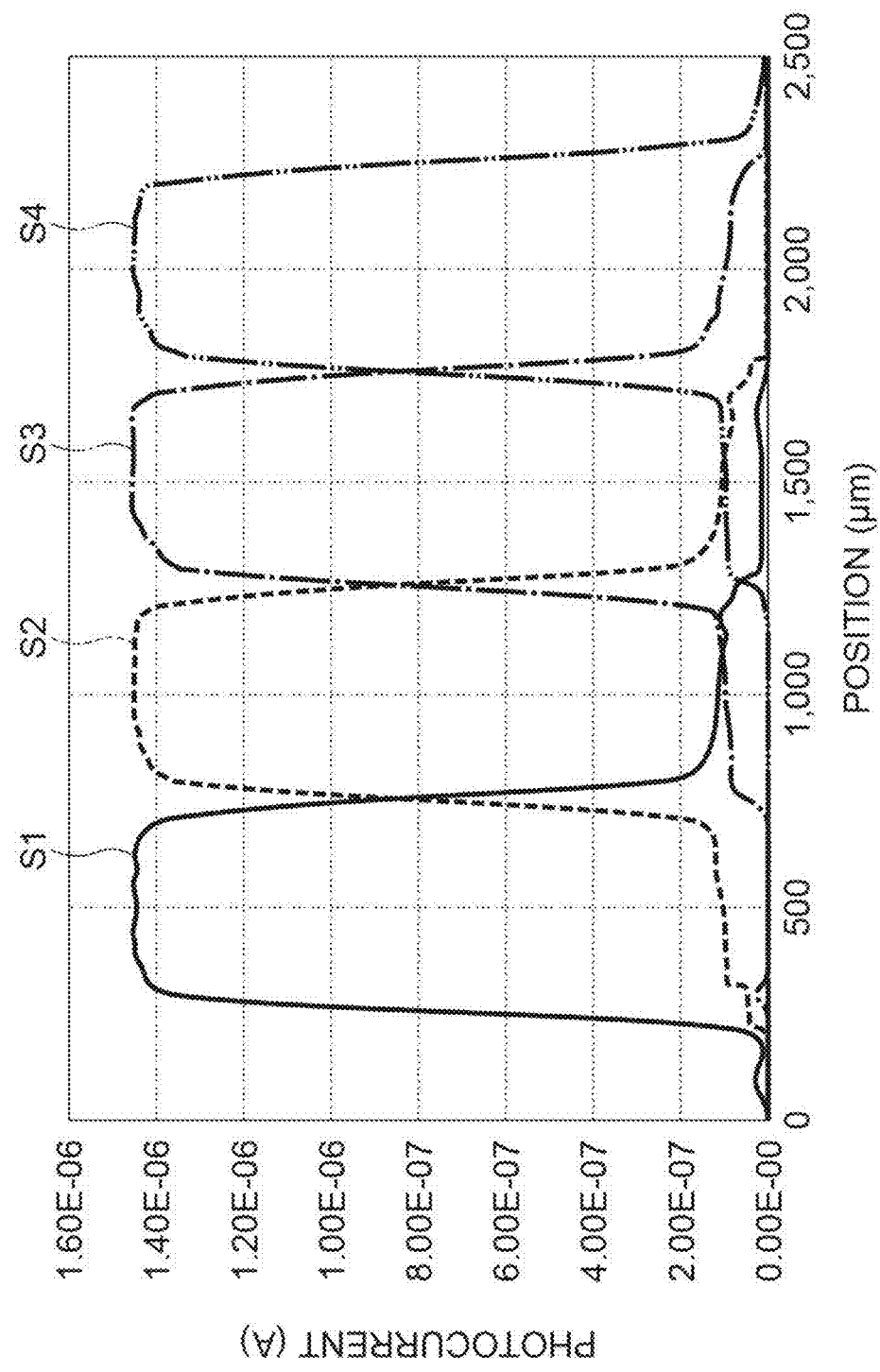
FIG. 12 is a diagram showing the evaluation results of the APD array.
Figure 13:
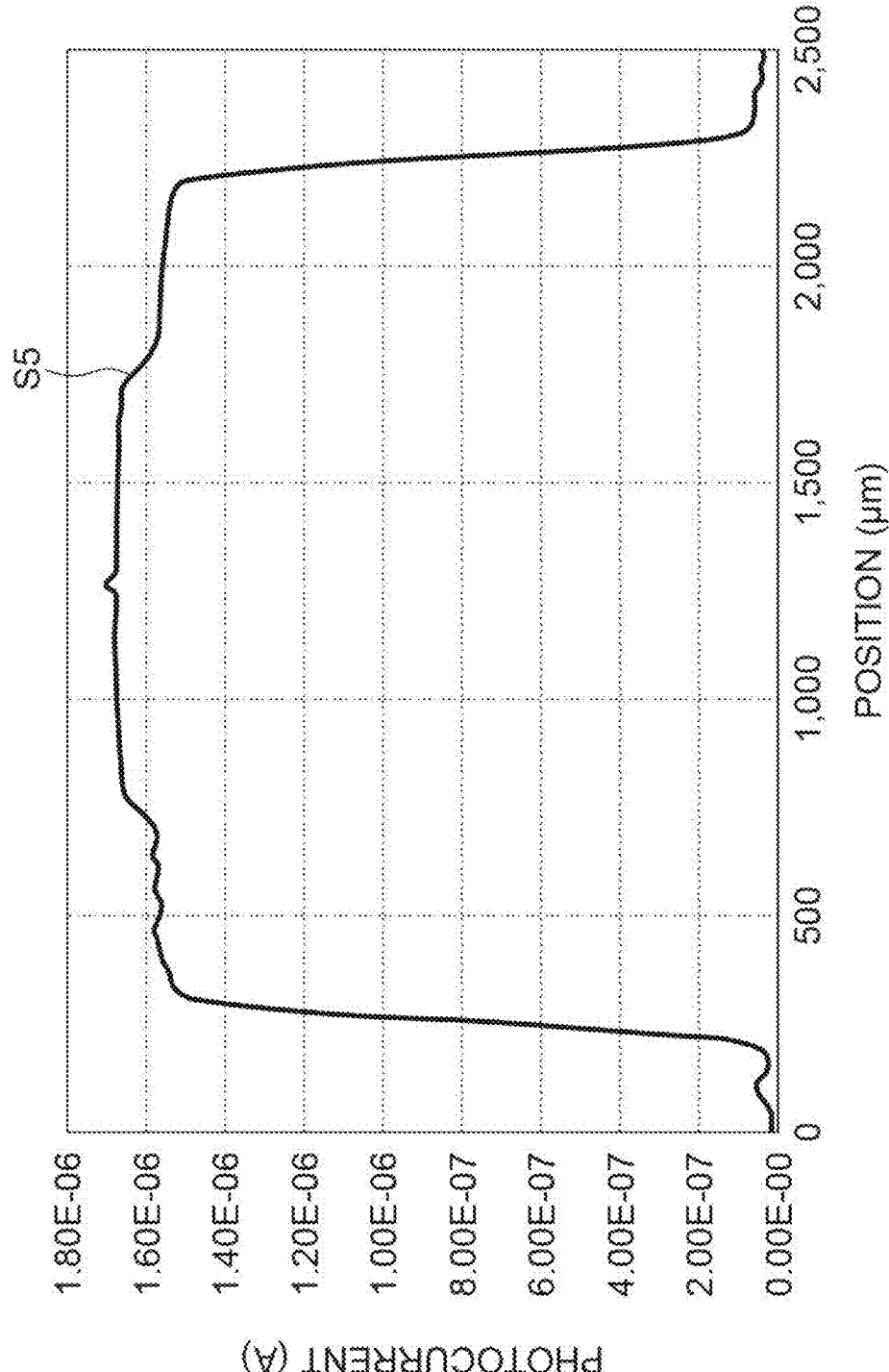
FIG. 13 is a diagram showing the evaluation results of the APD array.

In the APD arrays 1, 1A, 1B, 1C, 1D, 1E, 1F, and 1G, the multiplication layer 40 is continuously provided so as to overlap the plurality of second semiconductor layers 22. According to this configuration, the gain variation in each APD 15 can also be suppressed. FIGS. 12 and 13 show the evaluation results of the APD array 1. In this evaluation, laser beams were swept in the X-axis direction so as to pass through the four second semiconductor layers 22 arranged in the X-axis direction.

FIG. 12 shows the output of the APD 15 corresponding to each second semiconductor layer 22 according to the laser beam emission position. In FIG. 12, the horizontal axis indicates the laser emission position, and the vertical axis indicates the output current value. Each of signals S1 and S2 indicates an output from the APD 15 corresponding to each second semiconductor layer 22.

FIG. 13 shows the overall output of the APD array 1 according to the laser beam emission position. In FIG. 13, the horizontal axis indicates the laser emission position, and the vertical axis indicates the output current value. A signal S5 indicates the sum of outputs from the respective APDs 15. Thus, according to the APD array 1, it was confirmed that the gain variation between the APDs 15 was suppressed and the APDs 15 operated with a uniform gain.

In the APD arrays 1, 1A, 1B, 1C, 1D, 1E, 1F, and 1G, the shortest distance L11 between the first semiconductor layer 21 and the fourth semiconductor layer 24 in the Z-axis direction is greater than the shortest distance L12 between the plurality of second semiconductor layers 22 and the third semiconductor layer 23 in the Z-axis direction. In this case, the sensitivity layer 55 between the first semiconductor layer 21 and the fourth semiconductor layer 24 is secured relatively widely. Therefore, the detection accuracy of electromagnetic waves or particle beams that require a relatively wide sensitivity layer 55 can be improved. For example, near-infrared rays with wavelengths longer than 6000 nm, X-rays with wavelengths shorter than ultraviolet rays, and high-energy particle beams easily pass through the semiconductor substrate. If the relatively wide sensitivity layer 55 is secured, the detection accuracy of electromagnetic waves with wavelengths of 600 nm to 1200 nm and high-energy rays, such as X-rays, can also be improved.

Figure 14:
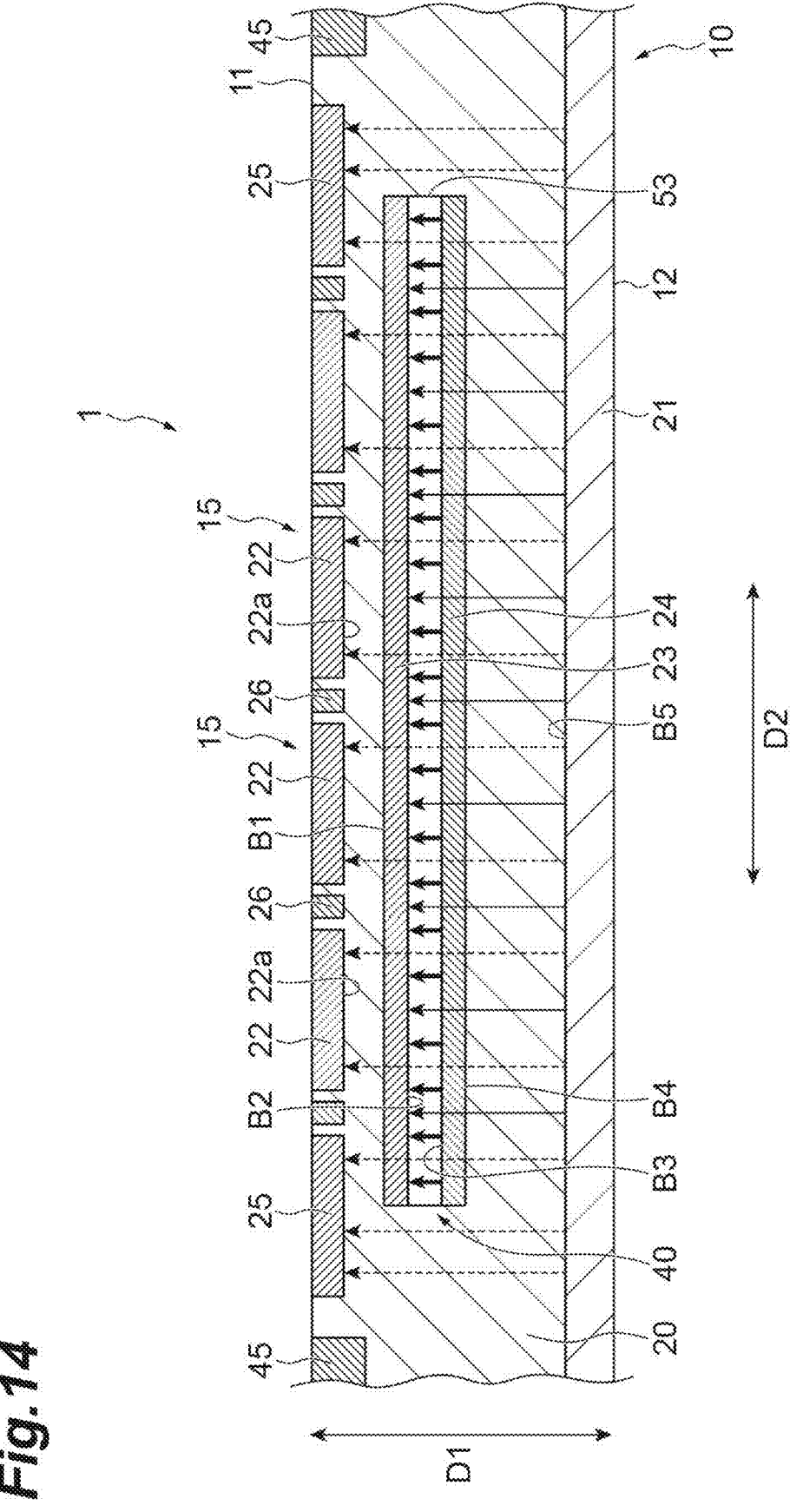
FIG. 14 is a schematic diagram showing an electric field between semiconductor layers.

FIG. 14 is a schematic diagram showing the electric field between semiconductor layers. Each arrow indicates an electric line of force. The electric field strength of an electric field E1 between the surface 22a of each second semiconductor layer 22 and the boundary B1 may be any electric field strength at which carriers multiplied in the multiplication layer 40 are branched and guided. The electric field strength of the electric field E1, that is, the electric field strength of the branch layer 51 is, for example, $10^1$ to $10^2$ V/cm. If the electric field strength of the electric field E1 exceeds $10^3$ V/cm, edge breakdown may occur, which is a risk. The electric field strength of an electric field E2 between the boundary B5 and the boundary B2 may be any electric field strength at which the generated carriers are sufficiently accelerated (drifted). In order to ensure responsiveness, the electric field strength of the electric field E2, that is, the electric field strength of the sensitivity layer 55 is, for example, about $10^2$ to $10^4$ V/cm. The electric field strength of an electric field E3 between the boundary B3 and the boundary B4 may be any electric field strength at which inflowing carriers are multiplied. The electric field strength of the electric field E3, that is, the electric field strength of the high electric field layer 53 is, for example, about $10^5$ to $10^6$ V/cm.

Figure 15:
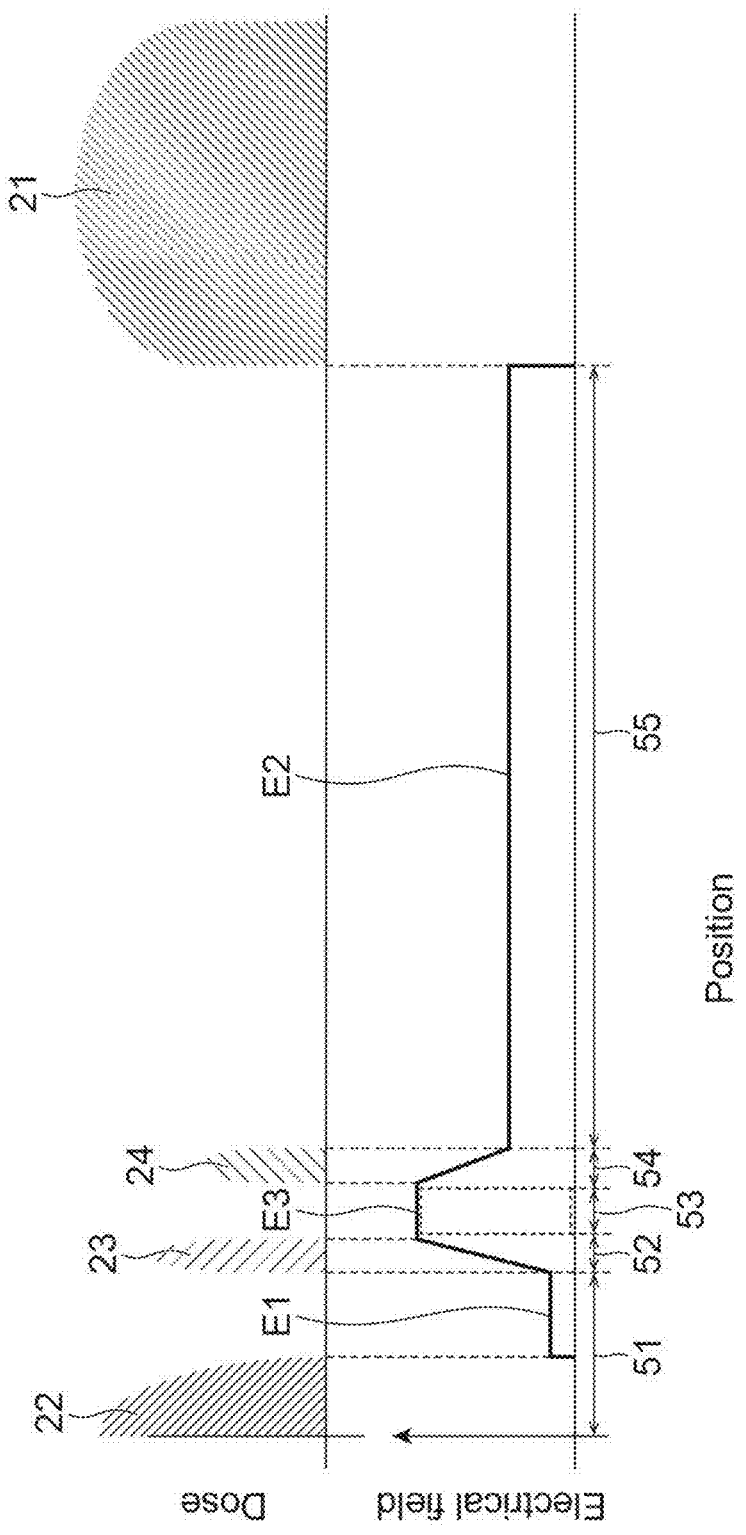
FIG. 15 is a schematic diagram showing an electric field strength in a semiconductor substrate.

In the APD arrays 1, 1A, 1B, 1C, 1D, 1E, 1F, and 1G, the impurity concentration of the third semiconductor layer 23 is higher than the impurity concentration of the fourth semiconductor layer. In this case, during operation, the electric field strength of the electric field E3 between the first semiconductor layer 21 and the fourth semiconductor layer 24 is greater than the electric field strength of the electric field E1 between the first surface 11 and the third semiconductor layer 23. FIG. 15 is a schematic diagram showing the electric field strength in a semiconductor substrate. The relationship among the electric fields E1, E2, and E3 described above depends on the impurity concentration of the third semiconductor layer 23 and the impurity concentration of the fourth semiconductor layer. If the impurity concentration of the third semiconductor layer 23 is higher than the impurity concentration of the fourth semiconductor layer, the relationship of electric field E3>electric field E2>electric field E1 can be satisfied. Therefore, since the movement speed of the generated carriers is ensured between the first semiconductor layer 21 and the fourth semiconductor layer 24, high-speed response can be realized. Edge breakdown between the plurality of second semiconductor layers 22 and the multiplication layer 40 can be further suppressed.

In the APD arrays 1, 1A, 1B, 1C, 1D, 1E, 1F, and 1G, Equation (3) is satisfied.

[Equation 3]

$$\int_A^{A+L_\alpha} f(x)\ dx \ge \int_B^{B+L_\beta} g(x)\ dx \tag{3}$$

"x" is any position from the first surface 11 in the Z-axis direction. "f(x)" is the impurity concentration of the third semiconductor layer 23 at the any position "x". "g(x)" is the impurity concentration of the fourth semiconductor layer 24 at the any position "x". "$L_\alpha$" is the thickness of the third semiconductor layer 23 in the Z-axis direction. "$L_\beta$" is the thickness of the fourth semiconductor layer 24 in the Z-axis direction. "A" is the shortest distance between the first surface 11 and the third semiconductor layer 23 in the Z-axis direction. "B" is the shortest distance between the first surface 11 and the fourth semiconductor layer 24 in the Z-axis direction. The relationship among the electric fields E1, E2, and E3 described above depends on the impurity integration amount of the third semiconductor layer 23 and the impurity integration amount of the fourth semiconductor layer. If the impurity integration amount of the third semiconductor layer 23 is higher than the impurity integration amount of the fourth semiconductor layer, the relationship of electric field E3>electric field E2>electric field E1 can be satisfied. In this case, since the movement speed of the generated carriers is ensured between the first semiconductor layer 21 and the fourth semiconductor layer 24, high-speed response can be realized. Edge breakdown between the plurality of second semiconductor layers 22 and the multiplication layer 40 can be further suppressed.

Each of the semiconductor substrates 10, 10A, 10B, 10C, 10D, 10E, 10F, and 10G includes the fifth semiconductor layer 25 of the second conductivity type surrounding the entire region where the plurality of second semiconductor layers 22 are arranged when viewed in the Z-axis direction. When viewed in the Z-axis direction, the third semiconductor layer 23 and the fifth semiconductor layer 25 overlap each other at least in part. In this case, the gain variation in each second semiconductor layer 22 can be further reduced. In addition, the movement of carriers generated outside the detection target area DA to the second semiconductor layer 22 can be suppressed.

In the APD arrays 1A and 1B, the edge 22b of each second semiconductor layer 22 is covered by the junction termination extension regions 27 and 27C when viewed in the Z-axis direction. The junction termination extension regions 27 and 27C covering each second semiconductor layer 22 are the semiconductor region 20 of the second conductivity type having an impurity concentration lower than that of the second semiconductor layer 22. In this case, edge breakdown in each second semiconductor layer 22 can be further suppressed.

In the APD array 1A, a portion of each second semiconductor layer 22 facing the semiconductor region 20 is covered with the junction termination extension region 27. In this case, edge breakdown in each second semiconductor layer 22 can be further suppressed.

In the APD arrays 1A and 1B, the junction termination extension region 27 covering each second semiconductor layer 22 is spaced apart from the multiplication layer 40. In this case, the electric field strength between each second semiconductor layer 22 and multiplication layer 40 can be more uniform.

In the APD arrays 1A and 1B, the edge 25b of the fifth semiconductor layer 25 is covered by the junction termination extension regions 27 and 27C when viewed in the Z-axis direction. The junction termination extension regions 27 and 27C covering the fifth semiconductor layer 25 are second conductivity type semiconductor regions having an impurity concentration lower than that of the fifth semiconductor layer 25. In this case, edge breakdown in the fifth semiconductor layer 25 can be suppressed.

Each of the semiconductor substrates 10, 10A, 10B, 10C, 10D, 10E, 10F, and 10G includes the sixth semiconductor layer 26 of the first conductivity type. The sixth semiconductor layer 26 is provided between the second semiconductor layers 22 adjacent to each other, among the plurality of second semiconductor layers 22, when viewed in the Z-axis direction. The impurity concentration of the sixth semiconductor layer 26 is higher than the impurity concentration of the semiconductor region 20. In this case, the movement of carriers between the second semiconductor layers 22 adjacent to each other can be suppressed.

In the Z-axis direction, the thickness of the sixth semiconductor layer 26 may be smaller than the thickness of each second semiconductor layer 22. In this case, edge breakdown between the sixth semiconductor layer 26 and the third semiconductor layer 23 can be suppressed.

The semiconductor substrates 10, 10A, 10B, 10C, 10D, 10E, 10F, and 10G contain silicon. The second conductivity type is N-type. In semiconductor substrates containing silicon, electrons are more easily multiplied by about 20 times than holes. Therefore, the multiplication factor can be improved by providing the multiplication layer 40 for the N-type second semiconductor layer 22.

The semiconductor substrates 10, 10A, 10B, 10C, 10D, 10E, 10F, and 10G may contain indium phosphide. In this case, the second conductivity type may be P-type. In semiconductor substrates containing indium phosphide, holes are more easily multiplied than electrons. Therefore, the multiplication factor can be improved by providing the multiplication layer 40 for the P-type second semiconductor layer 22.

In the APD arrays 1, 1A, 1B, 1C, 1D, 1E, 1F, and 1G, the multiplication layer 40 is provided within a range of 10 μm or less from the first surface 11 in the Z-axis direction. In this case, the structure is relatively easy to form. In particular, when the multiplication layer 40 is formed by ion implantation, the multiplication layer 40 can be formed relatively easily.

In the APD arrays 1, 1A, 1B, 1C, 1D, 1E, 1F, and 1G, the width W1 of each second semiconductor layer 22 in a direction along the first surface 11 is greater than 10 μm. In this case, the size of each pixel to be detected can be secured.

In the APD arrays 1, 1A, 1B, and 1C, the multiplication layer 40 includes a pair of edges 41a and 41b facing each other when viewed in the Z-axis direction. Three or more of the plurality of second semiconductor layers 22 are arranged in a direction in which the pair of edges 41a and 41b face each other. When viewed in the Z-axis direction, the plurality of second semiconductor layers 22 are located between the pair of edges 41a and 41b in the facing direction. In this case, the gain variation in each second semiconductor layer 22 can be further suppressed.

In the APD arrays 1, 1A, 1B, 1C, 1D, 1E, 1F, and 1G, when viewed in the Z-axis direction, in the plurality of second semiconductor layers 22, the area of a region where each second semiconductor layer 22 and the multiplication layer 40 overlap each other is the same. In this case, the gain variation in each second semiconductor layer 22 can be further suppressed.

In the APD arrays 1, 1A, 1B, 1C, 1D, and 1E, the edges 41a, 41b, 41c, and 41d of the multiplication layer 40 overlap the metal layer 31 as a shielding member when viewed in the Z-axis direction. In this case, the generation of carriers outside the detection target area DA can be suppressed.

In the APD arrays 1, 1A, 1B, 1C, 1D, 1E, 1F, and 1G, when viewed in the Z-axis direction, the width W1 of each second semiconductor layer 22 is larger than the shortest distance L1 between the second semiconductor layers 22 adjacent to each other. In this case, since the directions of the electric lines of force from the second semiconductor layer 22 are aligned, generated carriers are easily guided to the second semiconductor layer 22.

Although the embodiment and modification examples of the present invention have been described above, the present invention is not necessarily limited to the above-described embodiment, and various changes can be made without departing from the scope of the present invention.

For example, in the semiconductor substrates 10, 10A, 10B, 10C, 10D, 10E, 10F, and 10G, another separator may be included instead of the plurality of sixth semiconductor layers 26. For example, a shallow trench isolation (STI) or LOCOS (LOCal Oxidation of Silicon) structure may be formed. In this case, the STI or LOCOS structure is formed at the position of each sixth semiconductor layer 26. However, in this case, the surface of the semiconductor substrate is not flat. When a structure in which a plurality of sixth semiconductor layers 26 are formed is used, the uniformity of the electric field strength in the multiplication layer 40 can be more improved than when the STI or LOCOS structure is used. When the STI or LOCOS structure is formed after the multiplication layer 40 is formed, the uniformity of the electric field strength in the multiplication layer 40 is more improved than when the STI or LOCOS structure is formed before the multiplication layer 40 is formed.

REFERENCE SIGNS LIST

1, 1A, 1B, 1C, 1D, 1E, 1F, 1G: APD array, 10, 10A, 10B, 10C, 10D, 10E, 10F, 10G: semiconductor substrate, 11: first surface, 12: second surface, 20: semiconductor region, 21: first semiconductor layer, 22: second semiconductor layer, 22b, 25b, 41a, 41b, 41c, 41d: edge, 23: third semiconductor layer, 24: fourth semiconductor layer, 25: fifth semiconductor layer, 26: sixth semiconductor layer, 27, 27C: junction termination extension region, 40: multiplication layer, 15: APD, L1, L11, L12: shortest distance, W1: width.

The invention claimed is:

1. An avalanche photodiode array, comprising:
a semiconductor substrate having a first surface and a second surface facing each other and including a semiconductor region of a first conductivity type, the semiconductor region being provided on the first surface side,
wherein the semiconductor substrate has a plurality of avalanche photodiodes arranged along the first surface,
the plurality of avalanche photodiodes include:
a first semiconductor layer of the first conductivity type, the first semiconductor layer being provided closer to the second surface than the semiconductor region;
a plurality of second semiconductor layers of a second conductivity type, the second semiconductor layers being arranged along the first surface and each surrounded by the semiconductor region when viewed in a direction perpendicular to the first surface; and
a multiplication layer provided within the semiconductor region and provided between the plurality of second semiconductor layers and the first semiconductor layer in the direction perpendicular to the first surface,
when viewed in the direction perpendicular to the first surface, the plurality of second semiconductor layers and the multiplication layer are provided within a range where the first semiconductor layer is located,
the multiplication layer includes a third semiconductor layer of the second conductivity type and a fourth semiconductor layer of the first conductivity type, the third semiconductor layer and the fourth semiconductor layer facing each other,
the third semiconductor layer is provided closer to the first surface than the fourth semiconductor layer,
each of the third semiconductor layer and the fourth semiconductor layer is continuously provided so as to overlap the plurality of second semiconductor layers when viewed in the direction perpendicular to the first surface,
when viewed in the direction perpendicular to the first surface, an edge of each of the second semiconductor layers is covered by a junction termination extension region, and
the junction termination extension region covering each of the second semiconductor layers is a semiconductor region of the second conductivity type having an impurity concentration lower than an impurity concentration of the second semiconductor layer.

2. The avalanche photodiode array according to claim 1, wherein an impurity concentration of the first semiconductor layer and an impurity concentration of the fourth semiconductor layer are higher than an impurity concentration of the semiconductor region,
the impurity concentration of the first semiconductor layer is higher than the impurity concentration of the fourth semiconductor layer, and
an impurity concentration of each of the second semiconductor layers is higher than an impurity concentration of the third semiconductor layer.

3. The avalanche photodiode array according to claim 1, wherein, in the direction perpendicular to the first surface, a shortest distance between the first semiconductor layer and the fourth semiconductor layer is greater than a shortest distance between the plurality of second semiconductor layers and the third semiconductor layer.

4. The avalanche photodiode array according to claim 1, wherein an impurity concentration of the third semiconductor layer is higher than an impurity concentration of the fourth semiconductor layer.

5. The avalanche photodiode array according to claim 1, wherein assuming that any position from the first surface in the direction perpendicular to the first surface is "x", an impurity concentration of the third semiconductor layer at the any position "x" is "f (x)", an impurity concentration of the fourth semiconductor layer at the any position "x" is "g (x)", a thickness of the third semiconductor layer in the direction perpendicular to the first surface is "$L_\alpha$", a thickness of the fourth semiconductor layer in the direction perpendicular to the first surface is "$L_\beta$", a shortest distance between the first surface and the third semiconductor layer in the direction perpendicular to the first surface is "A", and a shortest distance between the first surface and the fourth semiconductor layer in the direction perpendicular to the first surface is "B", Equation (1) is satisfied.

[Equation 1]

$$\int_A^{A+L_\alpha} f(x)\,dx \geq \int_B^{B+L_\beta} g(x)\,dx \qquad (1)$$

6. The avalanche photodiode array according to claim 1, wherein, when viewed in the direction perpendicular to the first surface, the semiconductor substrate includes a fifth semiconductor layer of the second conductivity type surrounding an entire region where the plurality of second semiconductor layers are arranged, and
when viewed in the direction perpendicular to the first surface, the third semiconductor layer and the fifth semiconductor layer overlap each other at least in part.

7. The avalanche photodiode array according to claim 6, wherein, when viewed in the direction perpendicular to the first surface, an edge of the fifth semiconductor layer is covered by a junction termination extension region, and
the junction termination extension region covering the fifth semiconductor layer is a semiconductor region of the second conductivity type having an impurity concentration lower than an impurity concentration of the fifth semiconductor layer.

8. The avalanche photodiode array according to claim 1, wherein a portion of each of the second semiconductor layers facing the semiconductor region is covered with the junction termination extension region.

9. The avalanche photodiode array according to claim 1, wherein the junction termination extension region covering each of the second semiconductor layers is spaced apart from the multiplication layer.

10. The avalanche photodiode array according to claim 1, wherein, when viewed in the direction perpendicular to the first surface, the semiconductor substrate includes a sixth semiconductor layer of the first conductivity type provided between the second semiconductor layers adjacent to each other among the plurality of second semiconductor layers, and an impurity concentration of the sixth semiconductor layer is higher than an impurity concentration of the semiconductor region.

11. The avalanche photodiode array according to claim 10, wherein, in the direction perpendicular to the first surface, a thickness of the sixth semiconductor layer is smaller than a thickness of each of the second semiconductor layers.

12. The avalanche photodiode array according to claim 1, wherein the semiconductor substrate contains silicon, and the second conductivity type is N-type.

13. The avalanche photodiode array according to claim 1, wherein the semiconductor substrate contains indium phosphide, and the second conductivity type is P-type.

14. The avalanche photodiode array according to claim 1, wherein the multiplication layer is provided within a range of 10 $\mu$m or less from the first surface in the direction perpendicular to the first surface.

15. The avalanche photodiode array according to claim 1, wherein a width of each of the second semiconductor layers in a direction along the first surface is greater than 10 $\mu$m.

16. The avalanche photodiode array according to claim 1, wherein, when viewed in the direction perpendicular to the first surface, the multiplication layer includes a pair of edges facing each other, three or more of the plurality of second semiconductor layers are arranged in a direction in which the pair of edges face each other, and when viewed in the direction perpendicular to the first surface, the plurality of second semiconductor layers are located between the pair of edges in the facing direction.

17. The avalanche photodiode array according to claim 1, wherein, when viewed in the direction perpendicular to the first surface, in the plurality of second semiconductor layers, an area of a region where each of the second semiconductor layers and the multiplication layer overlap each other is the same.

18. The avalanche photodiode array according to claim 1, wherein, when viewed in the direction perpendicular to the first surface, an edge of the multiplication layer overlaps a shielding member.

19. The avalanche photodiode array according to claim 1, wherein each of the avalanche photodiodes is of a front surface incidence type in which detection light is incident from the first surface or a back surface incidence type in which detection light is incident from the second surface.

20. The avalanche photodiode array according to claim 1, wherein, when viewed in the direction perpendicular to the first surface, a portion of each of the second semiconductor layers overlapping the multiplication layer has a rectangular shape extending in a direction along the first surface.

21. The avalanche photodiode array according to claim 1, wherein, when viewed in the direction perpendicular to the first surface, a width of each of the second semiconductor layers is greater than a shortest distance between the second semiconductor layers adjacent to each other.

\* \* \* \* \*